United States Patent
Turner et al.

(10) Patent No.: US 12,092,591 B2
(45) Date of Patent: Sep. 17, 2024

(54) SCAN PROCEDURE GENERATION SYSTEMS AND METHODS TO GENERATE SCAN PROCEDURES

(71) Applicant: Illinois Tool Works Inc., Glenview, IL (US)

(72) Inventors: Jackson Turner, Plymouth, MN (US); Joseph Schlecht, Edina, MN (US); Eric Ferley, Minneapolis, MN (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 17/853,022

(22) Filed: Jun. 29, 2022

(65) Prior Publication Data
US 2023/0003671 A1    Jan. 5, 2023

Related U.S. Application Data

(60) Provisional application No. 63/217,175, filed on Jun. 30, 2021.

(51) Int. Cl.
  *G06F 30/12*     (2020.01)
  *G01N 23/046*    (2018.01)
  *G01N 23/083*    (2018.01)

(52) U.S. Cl.
  CPC ......... *G01N 23/046* (2013.01); *G01N 23/083* (2013.01); *G06F 30/12* (2020.01);
  (Continued)

(58) Field of Classification Search
  CPC ............... G01N 23/046; G01N 23/083; G01N 2223/04; G01N 2223/419;
  (Continued)

(56) References Cited

U.S. PATENT DOCUMENTS

| | | | |
|---|---|---|---|
| 2012/0050528 A1* | 3/2012 | Davies | G01C 11/02 348/136 |
| 2019/0170667 A1 | 6/2019 | Schielein | |
| 2021/0116401 A1* | 4/2021 | Omlor | G01N 23/2252 |

FOREIGN PATENT DOCUMENTS

| | | | |
|---|---|---|---|
| DE | 102017100594 A1 * | 7/2017 | |
| EP | 3459463 | 3/2019 | |
| EP | 3809120 | 4/2021 | |

OTHER PUBLICATIONS

Translation of DE-102017100594-A1 (Year: 2017).*
(Continued)

*Primary Examiner* — David P Porta
*Assistant Examiner* — Mamadou Faye
(74) *Attorney, Agent, or Firm* — McAndrews, Held & Malloy, Ltd.

(57) ABSTRACT

An example scan procedure generation system includes: a display; a processor; and a computer readable storage medium comprising computer readable instructions which, when executed, cause the processor to: output, via the display, a first visual representation of an arrangement of a radiation source, a radiation detector, a workpiece positioner, and a workpiece; and based on positions and orientations of the radiation source, the radiation detector, the workpiece positioner, and the workpiece, generate a scanning procedure for execution by a physical scanner having a physical radiation source, a physical radiation detector, and a physical workpiece positioner, wherein the generated scanning procedure comprises a plurality of movements of one or more of the physical radiation source, the physical radiation detector, and the physical workpiece positioner and a plurality of image captures to capture a plurality of scan images of a physical workpiece corresponding to the workpiece in the first virtual representation.

20 Claims, 17 Drawing Sheets

(52) U.S. Cl.
CPC . *G01N 2223/04* (2013.01); *G01N 2223/1016* (2013.01); *G01N 2223/305* (2013.01); *G01N 2223/306* (2013.01); *G01N 2223/419* (2013.01)

(58) Field of Classification Search
CPC ....... G01N 2223/305; G01N 2223/306; G01N 23/04; G06F 30/12
See application file for complete search history.

(56) References Cited

OTHER PUBLICATIONS

Int'l Search Report and Written Opinion Appln No. PCT/US2022/035683 mailed Sep. 26, 2022.
Hatamikia Sepideh et al: "Optimization for customized trajectories in cone beam computed tomography", Medical Physics., vol. 47, No. 10, Aug. 29, 2020 (Aug. 29, 2020), pp. 4786-4799, XP055961128, US ISSN: 0094-2405, DOI: 10.1002/mp.14403 Retrieved from the Internet: URL:https://onlinelibrary.wiley.com/doi/full-xml/10.1002/mp. 14403>.

\* cited by examiner

SCAN PROCEDURE GENERATION SYSTEMS AND METHODS TO GENERATE SCAN PROCEDURES

BACKGROUND

This disclosure relates generally to radiography and, more particularly, to scan procedure generation systems and methods to generate scan procedures.

X-ray scanning systems involve directing high-intensity radiation toward a device or object under test to obtain one or more images that may not be obtainable using other scanning systems (e.g., ultrasound, visible light, etc.). X-ray scanning systems may have multiple parameters that are dependent on the relative arrangements of the components in the X-ray scanning system.

SUMMARY

Scan procedure generation systems and methods to generate scan procedures are disclosed, substantially as illustrated by and described in connection with at least one of the figures, as set forth more completely in the claims.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

The figures are not necessarily to scale. Wherever appropriate, similar or identical reference numerals are used to refer to similar or identical components.

DETAILED DESCRIPTION

Figure 1:
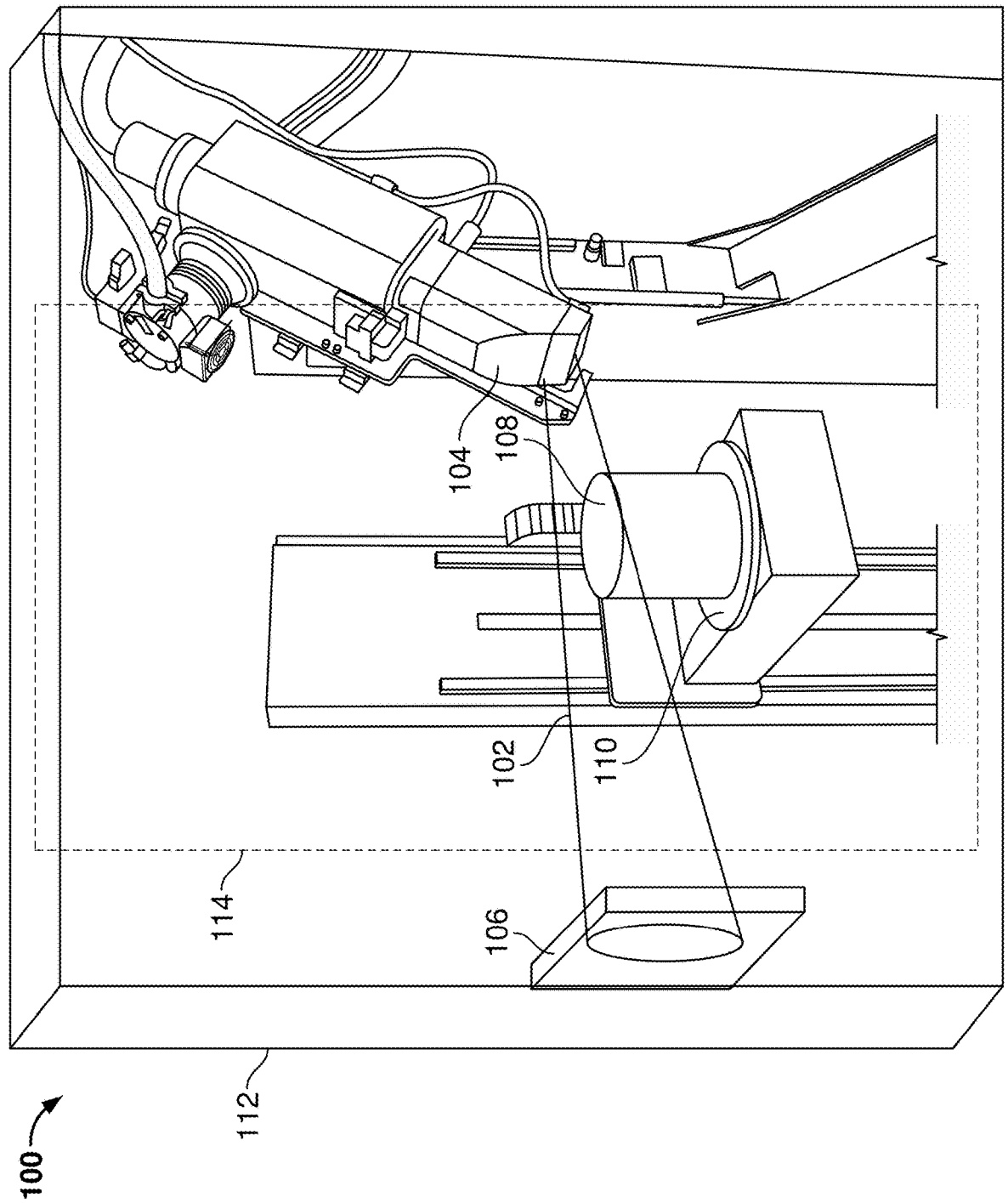
FIG. 1 illustrates an example X-ray scanning system that may be controlled using a scanner positioning control system based on a generated scan procedure, in accordance with aspects of this disclosure.

Conventional digital radiography (DR) and/or computed tomography (CT) scanner positioning systems involve a user interface that provides controls for individual modes of component positioning. For instance, a conventional scanner positioning system may include a number and a range representative of the height of the X-ray emitter, a number and a range representative of the height of the manipulator, and/or a number and a range representative of the height of the X-ray receiver. However, the person operating the controls may not have a clear idea of the final position resulting from a change to the number on the interface. Accordingly, conventional scanner positioning systems may involve significant trial-and-error on the part of the operator to determine the desired positioning to achieve the desired scan.

Development of the scan positioning and parameters is conventionally performed using a physical scanning system, which can impose substantial costs on the owner or operator of the system due to the loss in time available to actually perform scans. As a result, throughput of conventional scanning systems is reduced while the appropriate scanning procedure is determined by personnel, which can lead to increases costs and/or loss of revenue due to increased scanning cycle time.

Disclosed systems and methods enable scanning procedures to be generated in a virtual environment, which can be separate and/or remote from the scanning system or scanner positioning system (e.g., at any other location). For example, a design, test, or manufacturing engineer, or any other personnel, may use the virtual environment to position and/or orient the workpiece (e.g., object to be scanned) while obtaining interactive (e.g., real-time or substantially real-time) feedback to assist the user. The virtual environment and interactive feedback of disclosed examples enables the user to simulate and/or optimize factors that affect scanning technique development. The user may also specify radiation source and/or radiation detector parameters, and simulate the resulting scan via the virtual environment based on the component arrangements, the CAD model of the workpiece, and the source and detector parameters, to determine whether the designed scanning procedure will obtain the desired scan images.

In disclosed examples, generated scanning procedures include the necessary information and parameters to permit a scanner positioning control system to automatically perform the scanning procedure. For example, the generated scanning procedure may include commands to position, orient, and/or move a radiation source or emitter, a radiation detector, a workpiece positioner or manipulator, the workpiece or object to be scanned, and/or any other relevant components. The generated scanning procedure may further include operational parameters for the radiation source and/or the radiation detector. Other commands, parameters, data and/or information will be provided in examples disclosed below.

Disclosed systems and methods advantageously allow the user to design scanning techniques or procedures from any convenient location. In some examples, the user may use the disclosed systems and methods to design scanning procedures in a virtual environment and verify that the procedure will conform to the requirements of an industry standard (e.g., ASTM Standard E1695, ASTM Standard E2737, etc.) or required by a customer.

Disclosed examples are described with reference to X-rays. However, this disclosure is not limited to X-rays, and the examples disclosed herein may be modified to use any desired wavelengths or energies, or any combinations of wavelengths or energies, in the electromagnetic spectrum, such as gamma rays, monochromatic and/or polychromatic X-rays, white light, and/or neutron radiation.

As used herein, the term "arrangement" refers to both location and orientation of one or more components.

The terms "source" and "emitter," as used with reference to the source of radiation, are used interchangeably herein. In other words, as used herein, an "X-ray source" is the same as an "X-ray emitter."

Disclosed example scan procedure generation systems include: a display, a processor, and a computer readable storage medium comprising computer readable instructions which, when executed, cause the processor to: output, via the display, a first visual representation of an arrangement of a radiation source, a radiation detector, a workpiece positioner, and a workpiece; and based on positions and orientations of the radiation source, the radiation detector, the workpiece positioner, and the workpiece, generate a scanning procedure for execution by a physical scanner having a physical radiation source, a physical radiation detector, and a physical workpiece positioner, in which the generated scanning procedure comprises a plurality of movements of one or more of the physical radiation source, the physical radiation detector, and the physical workpiece positioner and a plurality of image captures to capture a plurality of scan images of a physical workpiece corresponding to the workpiece in the first virtual representation.

In some example scan procedure generation systems, the computer readable instructions cause the processor to: identify a change to be made to the arrangement of at least one of the radiation source, the radiation detector, the workpiece positioner, or the workpiece; and output, via the display, a second visual representation of the arrangement of the radiation source, the radiation detector, the workpiece positioner, and the workpiece based on the change to be made to the arrangement. In some example scan procedure generation systems, the computer readable instructions cause the processor to: render a projection of the workpiece on the radiation detector based on an arrangement of the radiation source, the radiation detector, the workpiece positioner, and the workpiece; and update the projection of the workpiece on the radiation detector in real-time in response to changes in the arrangement of one or more of the radiation source, the radiation detector, the workpiece positioner, or the workpiece.

In some example scan procedure generation systems, the computer readable instructions cause the processor to calculate the projection based on at least one of beam hardening; radiation energy or wavelength; a spectrum and/or other characteristics of a polychromatic beam; randomization or error in the accuracy of motion or positioning of one or more of the scanner components; motion dynamics; alignment of the radiation source, the radiation detector, the workpiece positioner, and the workpiece; accuracy or tolerance in positioning the workpiece on the workpiece positioner; a collimation characteristic of the radiation source; a focal spot size and/or shape of the radiation source; radiation scatter; the selected radiation spectrum; non-uniformity of the radiation cone; radiation flux; component degradation; variation in radiation emissions by the radiation source; source warmup time; scintillator efficiency of the radiation detector; scintillator resolution of the radiation detector; blur of the radiation detector; noise at the radiation detector; a defect in the radiation detector.

In some example scan procedure generation systems, the computer readable instructions cause the processor to determine whether a collision between one or more of the radiation source, the radiation detector, the workpiece positioner, or the workpiece and at least one other component has at least a threshold likelihood based on at least one of the first arrangement, a second arrangement following the change, or a movement from the first arrangement to the second arrangement. In some example scan procedure generation systems, the computer readable instructions cause the processor to determine whether the collision has at least a threshold likelihood based further on positioning of one or more additional components in the physical scanner.

In some example scan procedure generation systems, the computer readable instructions cause the processor to render at least one of a cone of radiation or radiation collimation based on positioning of the radiation source. In some example scan procedure generation systems, the computer readable instructions cause the processor to render a projection of the workpiece on the radiation detector based on positioning of the radiation source, the radiation detector, the workpiece positioner, and the workpiece, and based on one or more radiation emission characteristics of the radiation source.

In some example scan procedure generation systems, the computer readable instructions cause the processor to generate a fixture model to support the workpiece on the workpiece positioner as defined in the generated scanning procedure. In some example scan procedure generation systems, the computer readable instructions cause the processor to load the workpiece into the first visual representation based on a computer aided drafting (CAD) model of the workpiece. In some example scan procedure generation systems, the computer readable instructions cause the processor to render a portion of the workpiece to indicate a characteristic of the workpiece based on at least one of data in the CAD model or data received from a modeling algorithm based on the CAD model.

In some example scan procedure generation systems, the computer readable instructions cause the processor to automatically determine one or more arrangements and movements of the radiation source, the radiation detector, the workpiece positioner, and the workpiece to generate a scan of the workpiece. In some example scan procedure generation systems, the computer readable instructions cause the processor to automatically determine the one or more arrangements and movements based on an identification of a boundary box enveloping a portion of the workpiece. In some example scan procedure generation systems, the computer readable instructions cause the processor to automatically determine the one or more arrangements and movements based on simulating two or more potential generated scanning procedures to determine respective three-dimensional computed tomography results or three-dimensional digital radiography results and comparing one or more aspects of the results determined via the simulations.

In some example scan procedure generation systems, the computer readable instructions cause the processor to simulate one or more sources of error in at least one of: the positioning of one or more of the radiation source, the radiation detector, the workpiece positioner, and the workpiece; movement of one or more of the radiation source, the radiation detector, the workpiece positioner, and the workpiece; an emission characteristic of X-ray radiation emitted by the radiation source; a detection characteristic of the radiation detector; or a characteristic of X-ray radiation in the system. In some example scan procedure generation systems, the computer readable instructions cause the processor to calculate a cycle time to physically perform the generated scanning procedure.

In some example scan procedure generation systems, the computer readable instructions cause the processor to calculate a three-dimensional computed tomography result or a three-dimensional digital radiography result based on simulating the generated scanning procedure. In some example scan procedure generation systems, the generated scanning procedure includes second instructions to be executed by the physical scanner to perform the plurality of movements and the plurality of image captures. In some example scan procedure generation systems, the generated scanning procedure is associated with an identifier of the workpiece.

In some example scan procedure generation systems, the instructions cause the processor to: determine dimensions of a virtual detector via the virtual environment, at least one of the dimensions being larger than a corresponding dimension of the physical radiation detector; and generate the scanning procedure based on the determined dimensions, the scanning procedure comprising arrangements of the physical radiation detector to meet the dimensions of the virtual detector.

FIG. 1 illustrates an example X-ray scanning system 100 that may be controlled using a scanner positioning control system using a generated scanning procedure. The example X-ray scanning system 100 may be used to perform non-destructive testing (NDT) and/or any other scanning application. The example X-ray scanning system 100 is configured to direct X-rays 102 from an X-ray emitter 104 to an X-ray detector 106 through a workpiece 108 (e.g., are object under test). In the example of FIG. 1, a workpiece positioner 110 holds or secures the workpiece 108, and moves and/or rotates the workpiece 108 such that the desired portion and/or orientation of the workpiece 108 is located in the path of the X-ray radiation 102.

As discussed in more detail below, any of the X-ray emitter 104, the X-ray detector 106, and/or the workpiece positioner 110 may be positioned and/or reoriented using one or more actuators. Relative repositioning of the X-ray emitter 104, the X-ray detector 106, and/or the workpiece positioner 110 may result in different effects, such as changing the focal length, changing the focal point, changing an unsharpness parameter, changing a magnification (e.g., a ratio of distance between X-ray emitter and X-ray detector to distance between X-ray emitter workpiece positioner or to workpiece), changing a portion of the workpiece 108 that is scanned, and/or other effects.

The X-ray scanning system 100 further includes an enclosure 112, in which the X-ray emitter 104, the X-ray detector 106, and the workpiece positioner 110 are enclosed. The enclosure 112 includes one or more doors 114 or other access openings to, for example, insert or remove the workpiece 108, perform servicing on any of the components within the enclosure 112, and/or otherwise access an interior of the enclosure 112.

The X-ray detector 106 of FIG. 1 generates digital images based on incident X-ray radiation (e.g., generated by the X-ray emitter 104 and directed toward the X-ray detector 106). The example X-ray detector 106 may include a fluoroscopy detection system and a digital image sensor configured to receive an image indirectly via scintillation, and/or may be implemented using a sensor panel (e.g., a CCD panel, a CMOS panel, etc.) configured to receive the X-rays directly, and to generate the digital images. In other examples, the X-ray detector 106 may use a solid state panel coupled to a scintillation screen and having pixels that correspond to portions of the scintillation screen. Example solid state panels may include CMOS X-ray panels and/or CCD X-ray panels.

Example implementations of the workpiece positioner 110 include a mechanical manipulator, such a platen having linear and/or rotational actuators, Other example workpiece positioners 110 may include robotic manipulators, such as robotic arms having 6 degrees of freedom (DOF).

While the example of FIG. 1 includes an X-ray emitter 104 and an X-ray detector 106, in other examples the scanning system 100 may perform scanning using radiation in other wavelengths.

Figure 2:
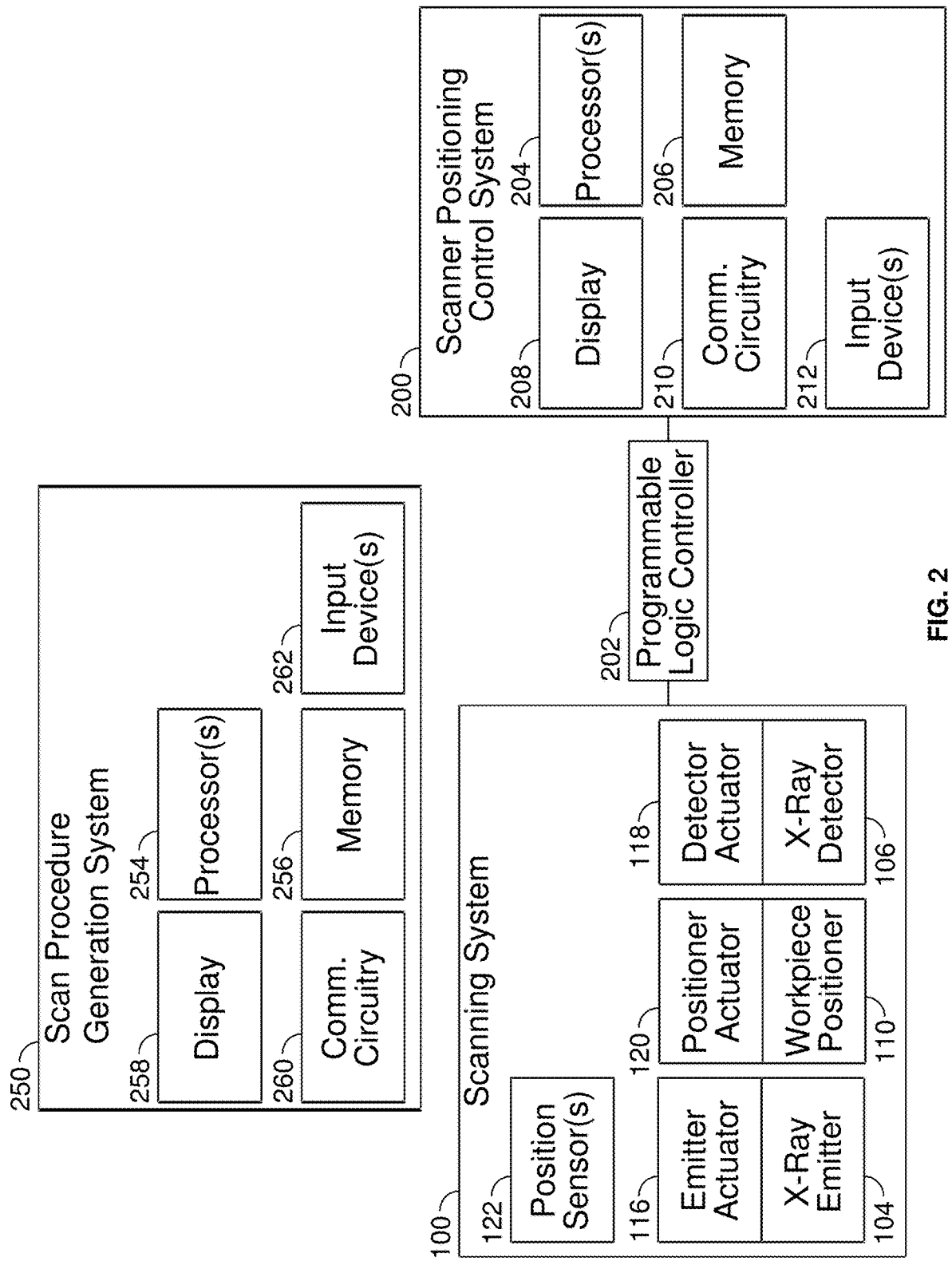
FIG. 2 is a block diagram of the example X-ray scanning system of FIG. 1, a scanning positioning control system, and a scan procedure generation system, in accordance with aspects of this disclosure.

FIG. 2 is a block diagram of the example X-ray scanning system 100 of FIG. 1, a scanning positioning control system 200, and a scan procedure generation system 250. As discussed above, the example X-ray scanning system 100 includes an X-ray emitter 104, an X-ray detector 106, a workpiece positioner 110. The example X-ray scanning system 100 further includes a source actuator 116, a detector actuator 118, and a positioner actuator 120.

The X-ray scanning system 100 of FIG. 2 is communicatively coupled to the scanner positioning control system 200. In some examples, a programmable logic controller (PLC) 202 or other interface device may couple the scanner positioning control system 200 to the X-ray scanning system 100. For example, the PLC 202 may enable a personal computer or other generic computing device to communicate with (e.g., command, obtain information from) the actuators 116-120 and/or sensor(s) of the scanning system 100.

The example scanner positioning control system 200 of FIG. 2 includes one or more processor(s) 204, memory 206 and/or other computer readable storage device(s), a display 208, communication circuitry 210, and one or more input device(s) 212. The scanner positioning control system 200 controls positioning of the X-ray emitter 104 (e.g., via the source actuator 116), positioning of the X-ray detector 106 (e.g., via the detector actuator 118), and/or positioning of the workpiece positioner 110 and/or the workpiece 108 (e.g., via the positioner actuator 120.

The scanner positioning control system 200 controls the X-ray emitter 104, receives digital images from the X-ray detector 106, and/or outputs the digital images to the display device 208. Additionally or alternatively, the scanner positioning control system 200 may store digital images to a storage device. The scanner positioning control system 200 may output the digital images as digital video to aid in real-time non-destructive testing and/or store digital still images.

The scanner positioning control system 200 further controls a scanner positioning system (e.g., the actuators 116, 118, 120, via the PLC 202) to physically move the X-ray emitter 104, the X-ray detector 106, and the workpiece positioner 110 based on inputs received via the input device(s) 212 and/or based on an automatic scanning procedure, which may be generated via the scan procedure generation system 250 and transferred to the scanner positioning control system 200 for execution. The processor(s) 204 calculate paths between the positions of the X-ray emitter 104, the X-ray detector 106, and the workpiece positioner 110 in a first arrangement and the positions of the physical components 104, 106, 110 in a subsequent arrangement. The processor(s) 204 then command the source actuator 116, the detector actuator 118, and/or the positioner actuator 120 to move the X-ray emitter 104, the X-ray detector 106, and the workpiece positioner 110 (e.g., via the PLC 202). In some examples, the PLC 202 may calculate the paths based on coordinate information communicated by the scanner positioning control system 200.

Similarly to the scanner positioning control system 200, the example scanner positioning control system 200 of FIG. 2 includes one or more processor(s) 254, memory 256 and/or other computer readable storage device(s), a display 258, communication circuitry 260, and one or more input device(s) 262.

The example scan procedure generation system 250 of FIG. 2 is communicatively coupled to the scanner positioning control system 200. For example, the scan procedure generation system 250 may be connected to the scanner positioning control system 200 via one or more computer networks, such as a local area network (LAN), a wide area network (WAN), the Internet, and/or any other type of network. In some examples, the scan procedure generation system 250 may transfer scan procedures to the scanner positioning control system 200 (or directly to the scanning system 100) via network-based file transfers and/or storage device file transfers. In other examples, the scan procedure generation system 250 and the scanner positioning control system 200 may have access to the same file repositories for storage and subsequent retrieval of generated scan procedures.

To reduce the trial-and-error involved in positioning the components 104-110, the example scan procedure generation system 250 outputs, via the display 208, a virtual environment including visual representations of arrangements of the X-ray emitter 104, the X-ray detector 106, and the workpiece positioner 110, which may be updated based on manipulation of the components 104, 106, 110 by the user.

Example operator input device(s) 212, 262 include buttons, switches, analog joysticks, thumbpads, trackballs, and/or any other type of user input device.

Figure 3A:
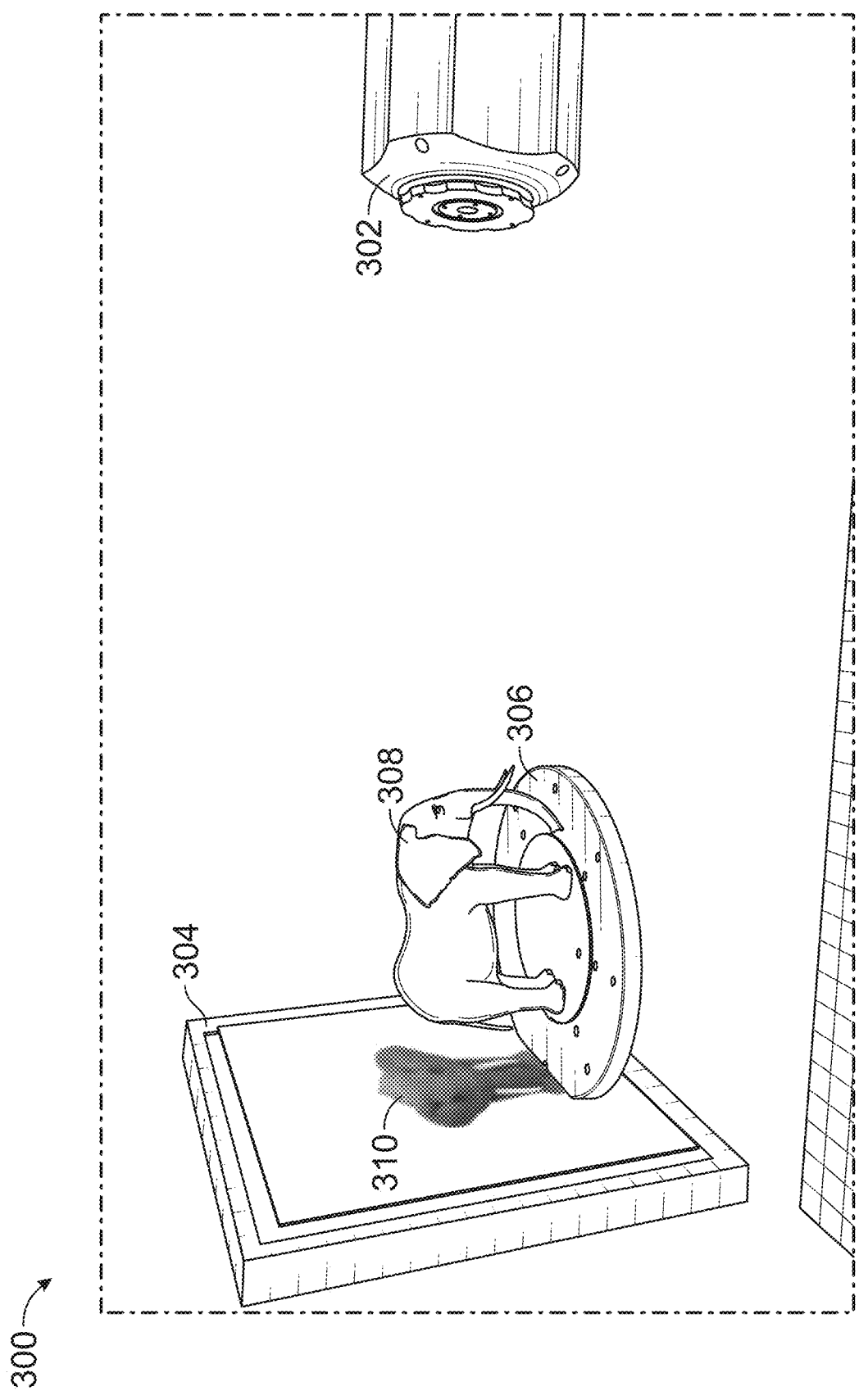
FIGS. 3A and 3B illustrate an example object displayed in multiple positions and/or orientations in a virtual environment which may be implemented on the scan procedure generation system of FIG. 2.

FIG. 3A illustrates a first example arrangement of components having first positions and/or orientations in a virtual environment 300, which may be implemented on the scan procedure generation system 250 of FIG. 2. The example virtual environment 300 includes virtual representations of a radiation source 302, a radiation detector 304, a workpiece positioner 306, and a workpiece 308. The radiation source 302, the radiation detector 304, and the workpiece positioner 306 are considered scanner components, while the workpiece 308 is considered separate from the scanner. In some examples, other scanner components may be rendered in the virtual environment, such as an enclosure of the scanning system.

The example scanner components 302-306 may be genericized for a generic scanning system, or may be rendered to be specific to a particular type of scanning system specified at the scan procedure generation system 250 for the virtual environment 300. Whether generic or specific to a scanning system, virtual environment may constrain positioning and/or orientation of the scanner components 302-306 based on predetermined or user-defined constraints.

In addition to the components, the user may load the workpiece 308 into the virtual environment 300 by commanding the scan procedure generation system 250 to load a CAD model of the workpiece 308. The CAD model may be any desired format supported by the scan procedure generation system 250. The CAD model may be created using CAD software, and/or created from data generated by a prior radiography scan (e.g., via the scanning system 100 of FIG. 1). In this manner, a user may perform a scan of a sample component, which may then be loaded into the virtual environment 300 for design of scan procedures for subsequent components of a similar or identical design.

Figure 3B:
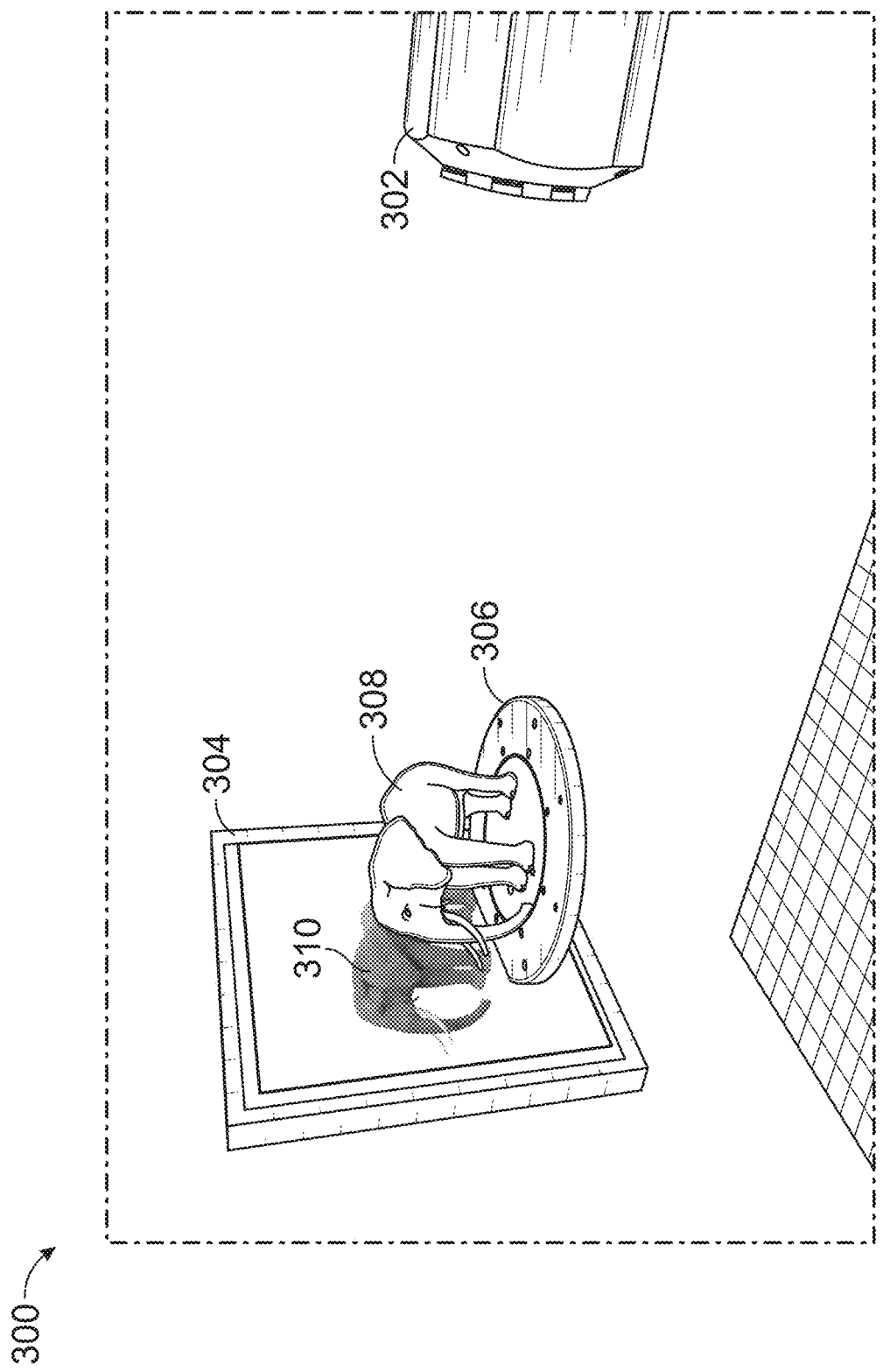

As mentioned above, the example scan procedure generation system 250 enables the user to change the positions and orientations of any of the radiation source 302, the radiation detector 304, the workpiece positioner 306, and the workpiece 308. FIG. 3B illustrates a second example arrangement of the components 302-308 having second positions and/or orientations in the virtual environment 300, as implemented on the scan procedure generation system 250 of FIG. 2. For example, the user may reposition and/or reorient the detector 304 (or other component) in the virtual environment 300 by clicking-and-dragging the detector 304 (or other component) to adjust a position and/or orientation, which may be represented by a second representation of the detector 304 (or other component) until the change is finalized by the user. The operator may repeatedly adjust the position(s) and/or orientation(s) of the components 302-308 until the desired position(s) and/or orientation(s) are achieved.

To aid the operator in determining the desired positions of the components 302-308 within the virtual environment 300, the example scan procedure generation system 250 may include additional visual representations on the virtual environment 300, such as projections of current and/or updated positions of the components 302-308 onto one or more reference planes. The reference plane(s) assist the user by displaying the relative current positions of the components 302-308 and/or the relative updated positions of the components 302-308 in a particular plane that may be difficult for the user to precisely perceive spatial relationships between the components.

Using the input device(s) 262, the example scan procedure generation system 250 may identify chance(s) to be made to the current arrangement (e.g., position(s) and/or orientation(s)) of at least one of the source 302, the detector 304, the workpiece positioner 306, and/or the workpiece 308. Based on the change(s) to the current arrangement in the virtual environment 300 identified via the input device(s) 262, the scan procedure generation system 250 displays the visual representation of the updated arrangement in the virtual environment 300. The example virtual environment 300 may be manipulated (e.g., via the input device(s) 262) to change the positions and/or orientations of the components 302-308 and/or the viewpoint angle of the virtual environment 300 (e.g., a camera angle, from which the arrangements are viewed in the virtual environment 300). As the operator manipulates the position and/or orientation of one or more of the component(s) 302-308, the scan procedure generation system 250 may generate a corresponding modified component and/or change the position of the modified component while maintaining the same position and/or orientation of the component(s) 302-308 in the current arrangement.

In some examples, the virtual environment 300 includes sufficient detail to make the virtual environment 300 closely resemble the physical scanning system 100. Such details may further improve the ability of the user to generate the scanning procedure.

The arrangements of the radiation source 302, the radiation detector 304, the workpiece positioner 306, and the workpiece 308 directly affect the resulting radiography or tomography scans generated by the scanning system 100. As illustrated in FIGS. 3A and 3B, the scan procedure generation system 250 may render a projection 310 of the workpiece 308 based on the arrangement of the radiation source 302, the radiation detector 304, the workpiece positioner 306, and the workpiece 308. In some examples, the projection 310 may be displayed directly on the virtual representation of the detector 304. Additionally or alternatively, the scan procedure generation system 250 may display the projection 310 in a separate window or frame, or otherwise outside of the virtual environment 300 so the display of the projection 310 is not subject to the viewing angle of the virtual environment 300.

As illustrated in FIGS. 3A and 3B, the projection 310 may be representative of a simulated radiography image captured by the detector 304 based on the current parameters and arrangement of components 302-308. As the arrangement and/or parameters change, the scan procedure generation system 250 interactively updates the projection 310 (e.g., real-time, in less than 2 seconds of update time, etc.). The interactive updating of the projection 310 assists the operator in determining the appropriate arrangements of the components 302-308 to obtain the desired DR or CT scan of the workpiece 308.

Figure 4:
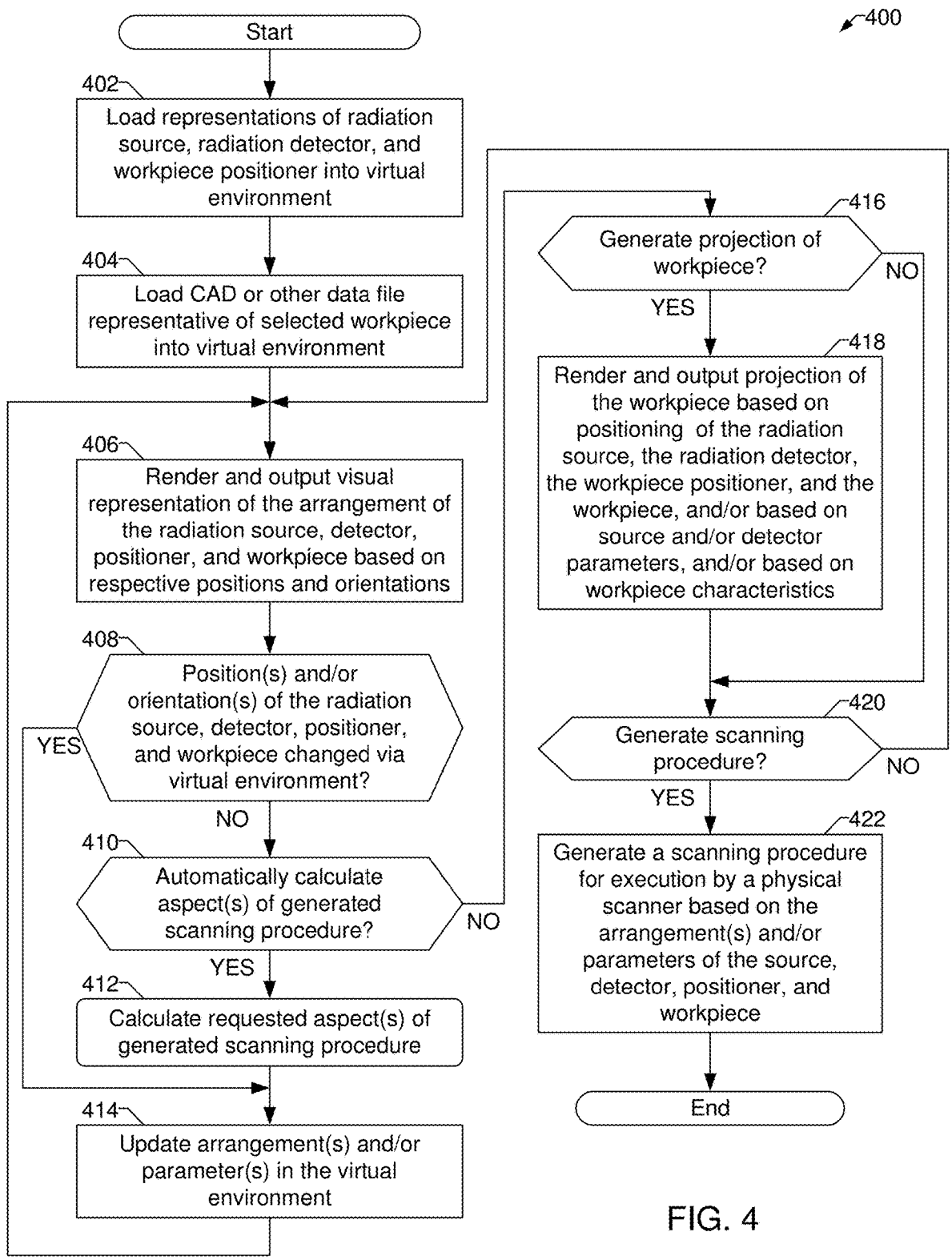
FIG. 4 is a flowchart representative of example machine readable instructions which may be executed by the example scan procedure generation system of FIG. 2 to generate a scanning procedure for execution by a physical scanning system.

FIG. 4 is a flowchart representative of example machine readable instructions 400 which may be executed by the example scan procedure generation system 250 of FIG. 2 to generate a scanning procedure for execution by a physical scanning system 100. The example instructions 400 are described below with reference to the example virtual environment of FIGS. 3A and 3B, and the scan procedure generation system 250.

At block 402, the scan procedure generation system 250 (e.g., via the processor(s) 254) load representations of the radiation source 302, the radiation detector 304, and the workpiece positioner 306 into the virtual environment 300. The representations of the radiation source 302, the radiation detector 304, and the workpiece positioner 306 may be selected and loaded based on a specific or target type or model of scanning system 100 having specific attributes for the radiation source 302, the radiation detector 304, and/or the workpiece positioner 306, or a generic scanning system.

At block 404, the scan procedure generation system 250 loads one or more CAD or other data files representative of a selected workpiece 308 (or combination of workpieces) into the virtual environment 300. The CAD file may be manually generated or automatically generated. An example of an automatically generated CAD file may be a tile based on contours determined from a prior DR or CT scan of the workpiece 308. In some examples, the radiation source 302, the radiation detector 304, the workpiece positioner 306, and/or the workpiece 308 are provided with default positions and/or orientations upon loading. The scan procedure generation system 250 may determine an initial position of the workpiece 308 based on matching orientation and/or location data in the CAD file to the position of the positioner 306.

At block 406, the scan procedure generation system 250 renders and outputs a visual representation of the arrangement of the radiation source 302, the radiation detector 304, the workpiece positioner 306, and the workpiece 308 in the virtual environment 300, based on the respective positions and orientations of the components 302-308. The rendering is also based on the camera angle or viewpoint of the virtual environment 300 on the display 258.

At block 408, the scan procedure generation system 250 determines whether the position(s) and/or orientation(s) of the radiation source 302, the radiation detector 304, the workpiece positioner 306, and/or the workpiece 308 have changed via the virtual environment 300. For example, the user may manipulate any of the components 302-308 to configure the scan characteristics.

If the position(s) and/or orientation(s) have not changed for one or more components 302-308 (block 408), at block 410 the scan procedure generation system 250 determines whether one or more aspects of the generated scanning procedure are to be automatically calculated. For example, the scan procedure generation system 250 may automatically calculate one or more scanning procedures, arrangements, parameter sets, fixtures, regions of interest of the workpiece 308, cycle times, boundary boxes for a scan, sources of potential error(s) such as component collisions, and/or any other aspects of a scanning procedure.

If one or more aspects of the generated scanning procedure are to be automatically calculated (block 410), at block 412 the scan procedure generation system 250 calculates requested aspects of the generated scanning procedure. For example, the user may select particular aspects of the generated scanning procedure to be calculated, and/or may request that an entire scanning procedure is calculated for review and/or modification. Example instructions that may be executed to implement block 412 are disclosed below with reference to FIGS. 5-10.

After calculating the requested aspect(s) (block 412), or if the position(s) and/or orientation(s) have changed for one or more components 302-308 (block 408), at block 414 the scan procedure generation system 250 updates the arrangement(s) and/or parameters in the virtual environment 300, and returns to block 406 to update the rendering of the component(s) 302-308.

If the position(s) and/or orientation(s) have not changed for one or more components 302-308 (block 408), and no further aspects of the generated scanning procedure are to be automatically calculated (block 410), at block 416 the scan procedure generation system 250 determines whether a projection or simulation of the scan is to be generated. For example, a user may select to simulate the radiation being output by the radiation source 302 and a corresponding image being generated by the detector 304 (e.g., "X-ray ON").

If a projection or simulation of the scan is to be generated (block 416), at block 418 the scan procedure generation system 250 renders and outputs a projection of the workpiece 308 based on the positioning of the source 302, the detector 304, the positioner 306, and the workpiece 308, based on the source and/or detector parameters, and/or based on characteristics of the workpiece 308. In some examples, scan procedure generation system 250 permits the user to choose to simulate and render one or more effects to the projection to enhance the realism, which can assist the user in improving the generated scan procedure. Example aspects that may be simulated by the scan procedure generation system 250 for the projection include: beam hardening; radiation energy or wavelength; a spectrum and/or other characteristics of a polychromatic beam; randomization or error in the accuracy of motion or positioning of one or more of the scanner components 302-306; motion dynamics (e.g., vibration); alignment of scanner components 302-306; accuracy or tolerance in positioning the workpiece 308 on the positioner 306; a collimation characteristic of the radiation source 302; a focal spot size and/or shape of the radiation source 302; radiation scatter; the selected radiation spectrum; non-uniformity of the radiation cone and/or radiation flux; component degradation (e.g., pitting of the tungsten target of an X-ray source); variation in radiation emissions by the radiation source 302; source warmup time; scintillator efficiency of the detector 304; scintillator resolution and/or blur of the detector 304; noise at the detector 304; and/or defects in the detector 304 (e.g., over-responsive, under-responsive, and/or non-responsive pixels). The scan procedure generation system 250 may render and output the projection 310 on a face of the detector 304, in a separate window or interface overlaid on or outside of the display of the virtual environment 300. The example scan procedure generation system 250 may update the projection in response to changes in the arrangements and/or parameters (e.g., block 408).

After rendering and outputting the projection 310 (block 418), or if the projection is not generated (block 416), at block 420 the scan procedure generation system 250 determines whether to generate a scanning procedure. For example, the user may indicate that the arrangement of the components 302-308 and/or the source and/or detector parameters are satisfactory.

If the scanning procedure is not to be generated (block 420), control returns to block 406 to continue rendering the virtual environment 300 and the components 302-308.

When the scanning procedure is to be generated (block 420), at block 422 the scan procedure generation system 250 generates a scanning procedure for execution by a physical scanner (e.g., the scanning system 100) based on the arrangement(s) of the component(s) 302-308, the defined parameters for the source 302, defined parameters for the detector 304, and/or parameters of the workpiece 308. The generated scanning procedure may be output as a file including instructions or commands that, when executed by the scanning system 100 (e.g., directly or via the scanner positioning control system 200), cause the scanning system 100 to implement positioning, orientation, movements, imaging, and/or image reconstruction for a DR or CT scan as defined in the scan procedure.

Example scanning instructions and/or parameters that may be specified in the generated scan procedure include: image acquisition arrangements (e.g., positions and orientations) of the components 302-308; workpiece loading and/or unloading positions; unobstructed paths around the workpiece 308 and/or workpiece fixturing; warm-up positions of the radiation source 302; a number of radiographs; a starting arrangement; an final or ending arrangement; detector averaging parameters; component positioning and/or speed during and/or between radiographs (e.g., instructions to rotate and/or translate the positioner 306, movement of the detector 304, etc.); radiation energy or wavelength parameters or settings for the source 302; a focal spot mode and/or type; physical radiation filtering; collimation; a region of interest on the detector 304; an integration time or framerate; binning; and/or gain. However, any other component positioning and/or orientation parameters, radiation source parameters, radiation detector parameters, and/or DR or CT reconstruction parameters may be included in the generated scan procedure for execution by a physical scanning system and/or scanner positioning control system.

In some examples, additional data may be associated with the generated scan procedure, such as an identifier of the workpiece 308 (e.g., a part number, a model number, a QR or bar code, etc.) that enables the scan procedure to be loaded in response to an input of the identifier at the scanner positioning control system 200. In some examples, fixturing information may also be associated with the scan procedure.

After generating the scanning procedure, the example instructions 400 end.

Figure 3C:
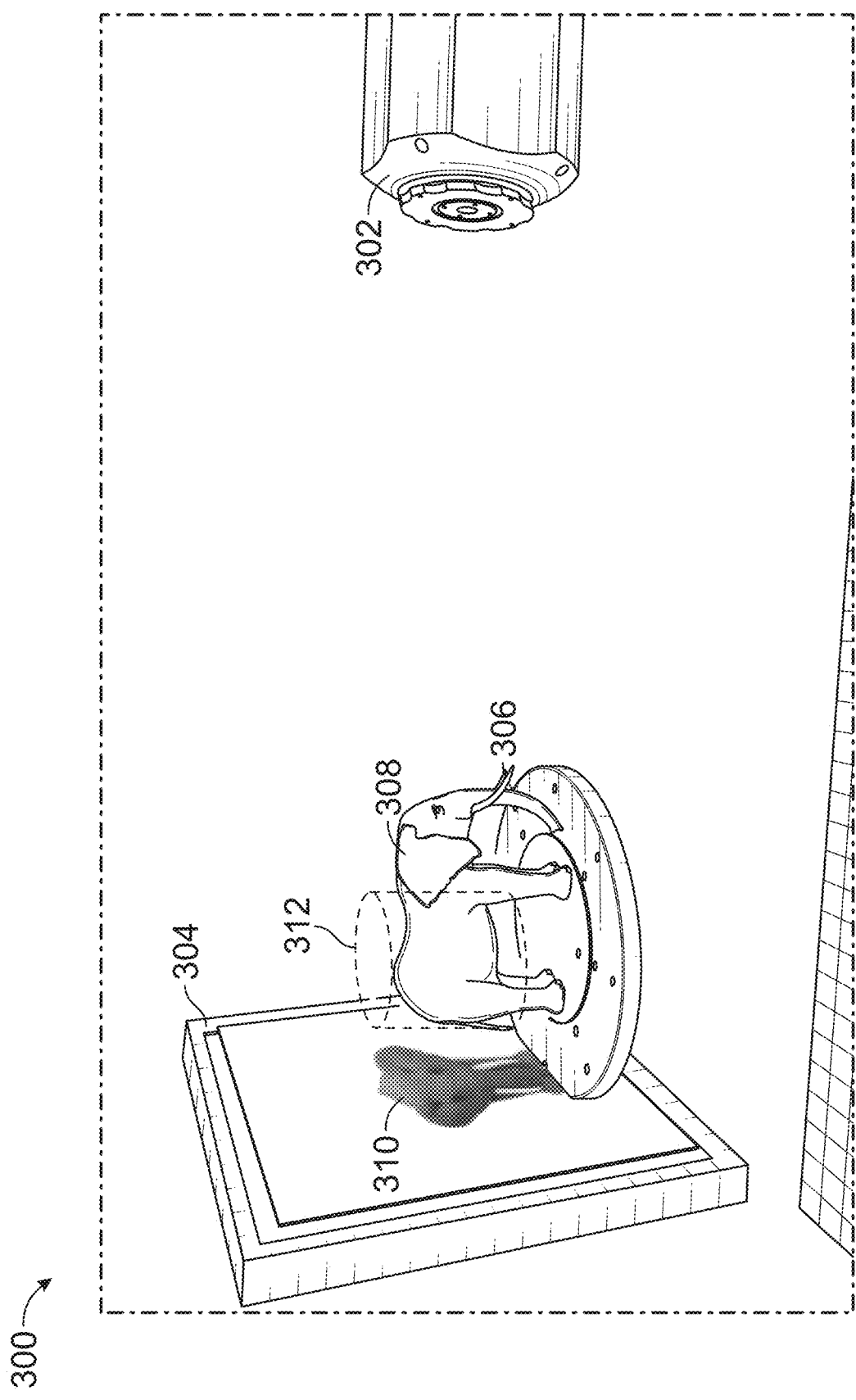
FIG. 3C illustrates an example object displayed in the example virtual environment, include a boundary box enveloping at least a portion of the object and specifying a portion of the object to be scanned, which may be implemented on the scan procedure generation system of FIG. 2.

FIG. 3C illustrates the example workpiece 308 displayed in the example virtual environment 300, include a boundary box 312 enveloping at least a portion of the workpiece 308 and specifying a portion of the workpiece 308 to be scanned, which may be implemented on the scan procedure generation system 250 of FIG. 2. The example boundary box 312 may be drawn by the user in the virtual environment 300, or may be automatically selected by the scan procedure generation system 250 to include regions of interest of the workpiece 308. The user may manipulate (e.g., resize, translate, redraw) the boundary box 312 within the virtual environment as desired.

In some examples, following the selection of the boundary box 312 in the virtual environment 300, the scan procedure generation system 250 determines at least a portion of the scan procedure to scan the volume within the boundary box 312. For example, the scan procedure generation system 250 may determine the positioning of the source 302 and the detector 304 with respect to the boundary box 312, and determine a position and/or orientation of the positioner 306, and/or determine the position of the workpiece 308 on the positioner 306, to scan the boundary box 312.

In some examples, the scan procedure generation system 250 provides a wizard-type interface which prompts the user for certain information and, based on the responses, automatically calculates a suggested scanning procedure. An example wizard interface may request that the user define the boundary box 312, a voxel size, and beam hardening characteristics, and generate a suggested scanning technique based on the provided information.

In some examples, the scan procedure generation system 250 limits DR or CT reconstructions from simulated scanning procedures to only reconstruct the portions of the workpiece 308 within the boundary box 312 to preserve computing resources.

Figure 5:
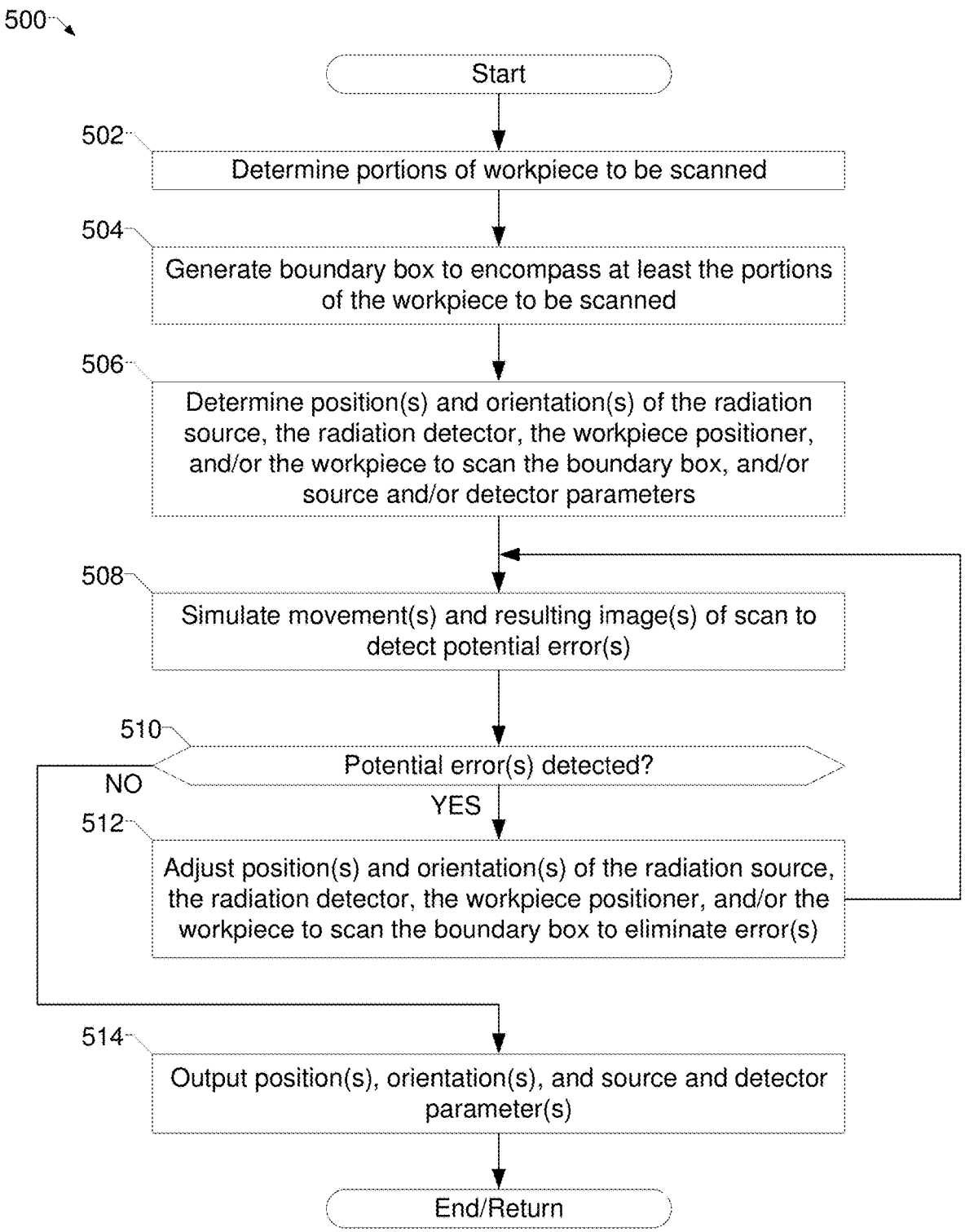
FIG. 5 is a flowchart representative of example machine readable instructions which may be executed by the example scan procedure generation system of FIG. 2 to automatically determine one or more arrangements and movements based on an identification of a boundary box enveloping a portion of the workpiece.

FIG. 5 is a flowchart representative of example machine readable instructions 500 which may be executed by the example scan procedure generation system 250 of FIG. 2 to automatically determine one or more arrangements and movements based on an identification of a boundary box enveloping a portion of the workpiece. The example instructions 500 are described below with reference to the example virtual environment of FIGS. 3A and 3B, and the scan procedure generation system 250, and may be executed to implement block 412 of FIG. 4.

At block 502, the scan procedure generation system 250 determines portions of the workpiece 308 that are to be scanned. For example, the scan procedure generation system 250 may determine that certain portions of the workpiece 308 have characteristics of interest for DR or CT scanning, the user may identify the portions of the workpiece 308, and/or the entire workpiece 308 may be scanned. At block 504, the scan procedure generation system 250 generates a boundary box to encompass at least the portions of the workpiece 308 to be scanned. In some examples, the boundary box has a cylindrical shape due to the arrangements and motion of the components 302-308. However, the boundary box may be configured with other shapes.

At block 506, the scan procedure generation system 250 determines the position(s) and orientation(s) of the components 302-308 to scan the boundary box, and/or the source and/or detector parameters for scanning. The position(s) and orientation(s) may be determined based on the geometry of the boundary box. In some examples, the source and/or detector parameters may be based on the characteristics of the workpiece, such as the material, density, and/or any other characteristics determined from the CAD file and/or specified by the user.

At block 508, the scan procedure generation system 250 simulates the movement(s) and resulting image(s) of the scan to detect potential error(s). Example errors that may be detected may include collisions between different ones of the components 302-308, and/or collisions between the components 302-308 and other elements of the scanning system 100 such as a cabinet or enclosure, wiring, support structure, and/or any other physical components; errors in the positioning of one or more of the radiation source, the radiation detector, the workpiece positioner, and the workpiece; movement of one or more of the radiation source, the radiation detector, the workpiece positioner, and the workpiece; an emission characteristic of X-ray radiation emitted by the radiation source; a detection characteristic of the radiation detector; or a characteristic of X-ray radiation in the system. In some examples, the scan procedure generation system 250 simulates wobble (e.g., imbalances or other inaccuracies in positioning of the positioner 306) or other errors in the positioner 306, and/or in other components 302, 304, 308. Additionally or alternatively, the scan procedure generation system 250 may perform Monte Carlo simulations of various parameters and/or resulting images for uncertainty estimation and/or predicting potential sources of errors.

In some examples, the scan procedure generation system 250 performs a simulation of a full DR or CT scan (e.g., simulating the generation of radiographs) using the determined position(s), orientation(s), and parameters using the CAD model of the workpiece 308, and performs a DR or CT reconstruction based on the simulated radiographs. The simulation of the full scan and the resulting simulated reconstruction may enable the user to identify potential problems with the proposed scanning procedure and make appropriate changes.

At block 510, the scan procedure generation system 250 determines whether potential error(s) are detected. If one or more errors are detected (block 510), at block 512 the scan procedure generation system 250 adjusts the position(s) and/or orientation(s) of one or more of the components 302-308 to scan the boundary box to eliminate the errors. Control then returns to block 508 to simulate the updated movements and resulting image(s) of the scan for any further errors.

When potential errors are not detected (block 510), at block 514 the scan procedure generation system 250 outputs the position(s) and orientation(s) of the component(s) 302-308 and/or the source and detector parameter(s). The position(s), orientation(s), and parameter(s) may be used to generate the scanning procedure and/or modified by the user. The example instructions 500 may then end.

Figure 6:
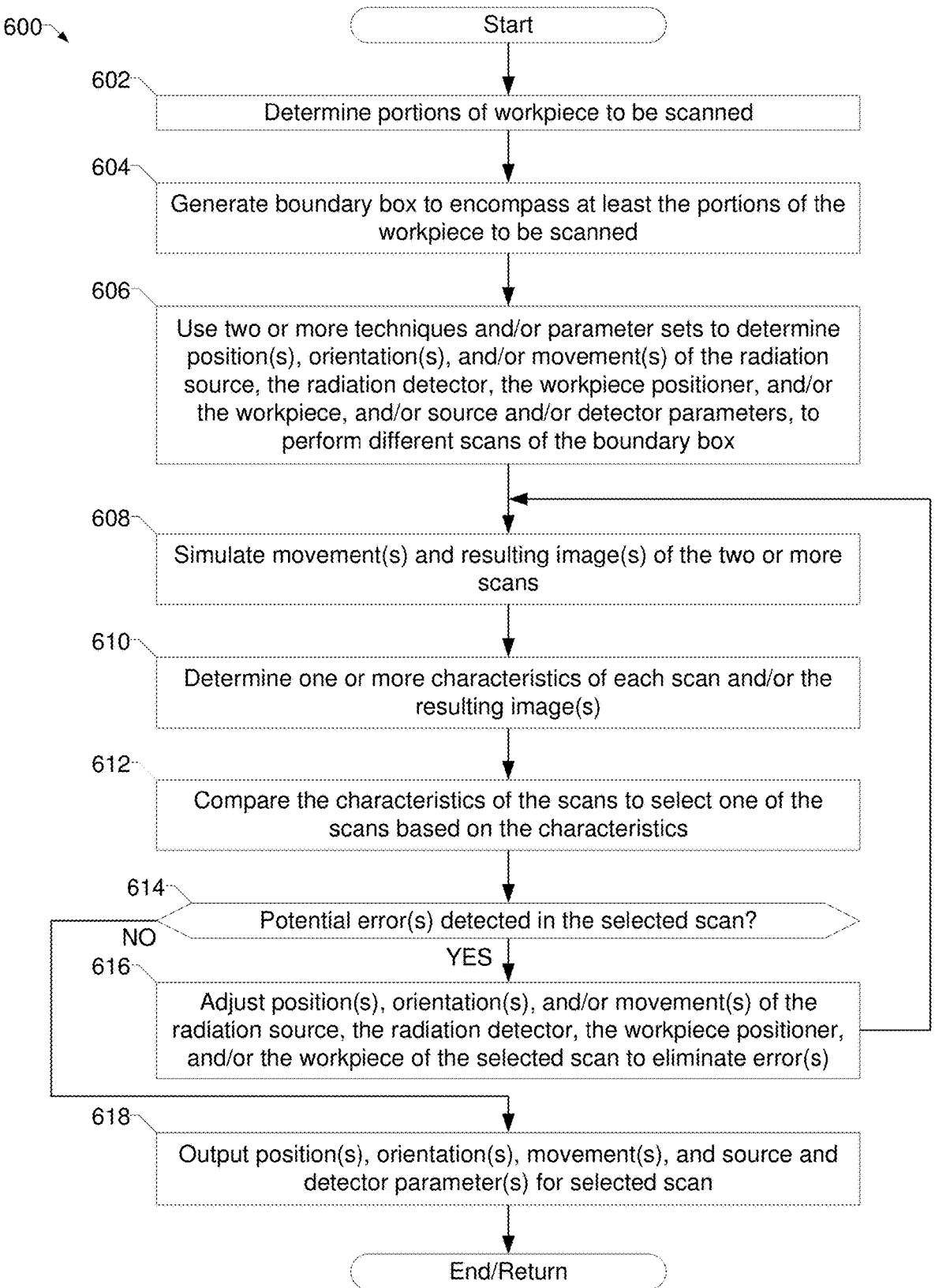
FIG. 6 is a flowchart representative of example machine readable instructions which may be executed by the example scan procedure generation system of FIG. 2 to automatically determine one or more arrangements and movements based on an identification of a boundary box enveloping a portion of the workpiece.

FIG. 6 is a flowchart representative of example machine readable instructions which may be executed by the example scan procedure generation system 250 of FIG. 2 to automatically determine one or more arrangements and movements based on an identification of a boundary box enveloping a portion of the workpiece 308. The example instructions 600 are described below with reference to the example virtual environment of FIGS. 3A and 3B, and the scan procedure generation system 250, and may be executed to implement block 412 of FIG. 4.

At block 602, the scan procedure generation system 250 determines portions of the workpiece 308 that are to be scanned. For example, the scan procedure generation system 250 may determine that certain portions of the workpiece 308 have characteristics of interest for DR or CT scanning, the user may identify the portions of the workpiece 308, and/or the entire workpiece 308 may be scanned. At block 604, the scan procedure generation system 250 generates a boundary box to encompass at least the portions of the workpiece 308 to be scanned. In some examples, the boundary box has a cylindrical shape due to the arrangements and motion of the components 302-308. However, the boundary box may be configured with other shapes.

At block 606, the scan procedure generation system 250 uses two or more techniques (e.g, planning algorithms) and/or parameter sets to determine positions, orientations, and/or movement(s) of the component(s) 302-308 and/or source and/or detector parameters to perform different scans of the boundary box 312. For example, the scan procedure generation system 250 may have multiple techniques and/or planning algorithms stored for use in procedure planning, Different ones of the planning algorithms may be optimized for particular types of scans and/or arrangements.

At block 608, the scan procedure generation system 250 simulates the movement(s) and resulting image(s) of the two or more scans (e.g., based on the different planning algorithms). At block 610, the scan procedure generation system 250 determines one or more characteristics of each scan and/or set of resulting image(s). For example, the scan procedure generation system 250 may determine whether each of the scans results in any errors, provides less than a threshold image quality, and/or otherwise satisfies or fails to satisfy conditions for a satisfactory scan.

At block 612, the scan procedure generation system 250 compares the characteristics of the scans to select one of the scans based on the characteristics. For example, the scan procedure generation system 250 may determine which of the scans provides a preferred image quality and/or avoids errors such as collisions. The selected scan may provide a preferred combination of quantitative values determined from the simulations.

At block 614, the scan procedure generation system 250 determines whether potential errors are detected in the selected scan. If one or more errors are detected (block 614), at block 616 the scan procedure generation system 250 adjusts the position(s) and/or orientation(s) of one or more of the components 302-308 to scan the boundary box to eliminate the errors. Control then returns to block 608 to simulate the updated movements and resulting image(s) of the scan for any further errors. The example scan procedure generation system 250 may update the parameters for the algorithms simulated in a prior iteration.

When potential errors are not detected (block 614), at block 618 the scan procedure generation system 250 outputs the position(s) and orientation(s) of the component(s) 302-308 and/or the source and detector parameter(s). The position(s), orientation(s), and parameter(s) may be used to generate the scanning procedure and/or modified by the user. The example instructions 600 may then end.

Figure 3D:
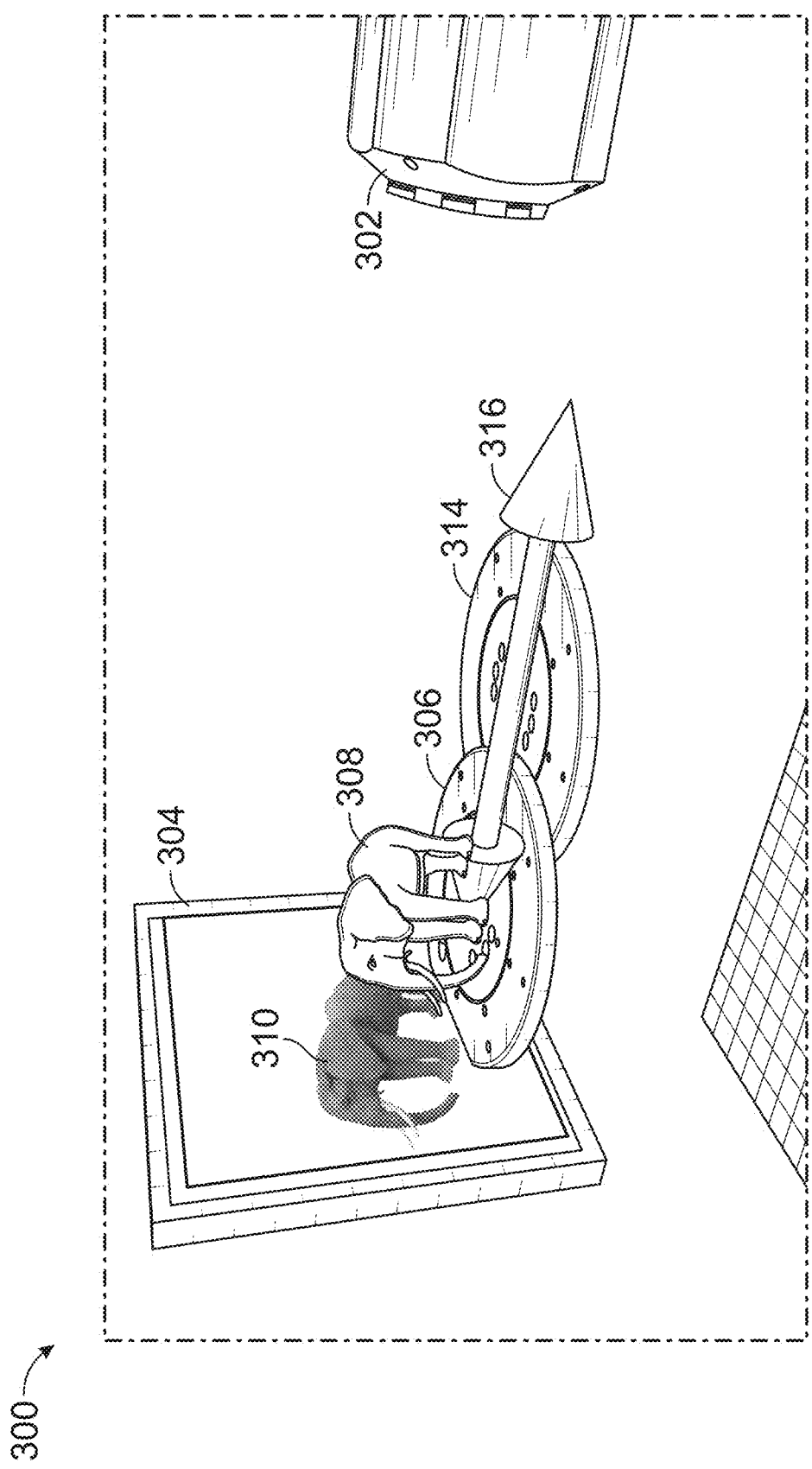
FIGS. 3D and 3E illustrate an example change in position and orientation using the virtual environment, and an interactive change in the rendering of a projection of the object on a radiation detector, which may be implemented on the scan procedure generation system of FIG. 2.
Figure 3E:
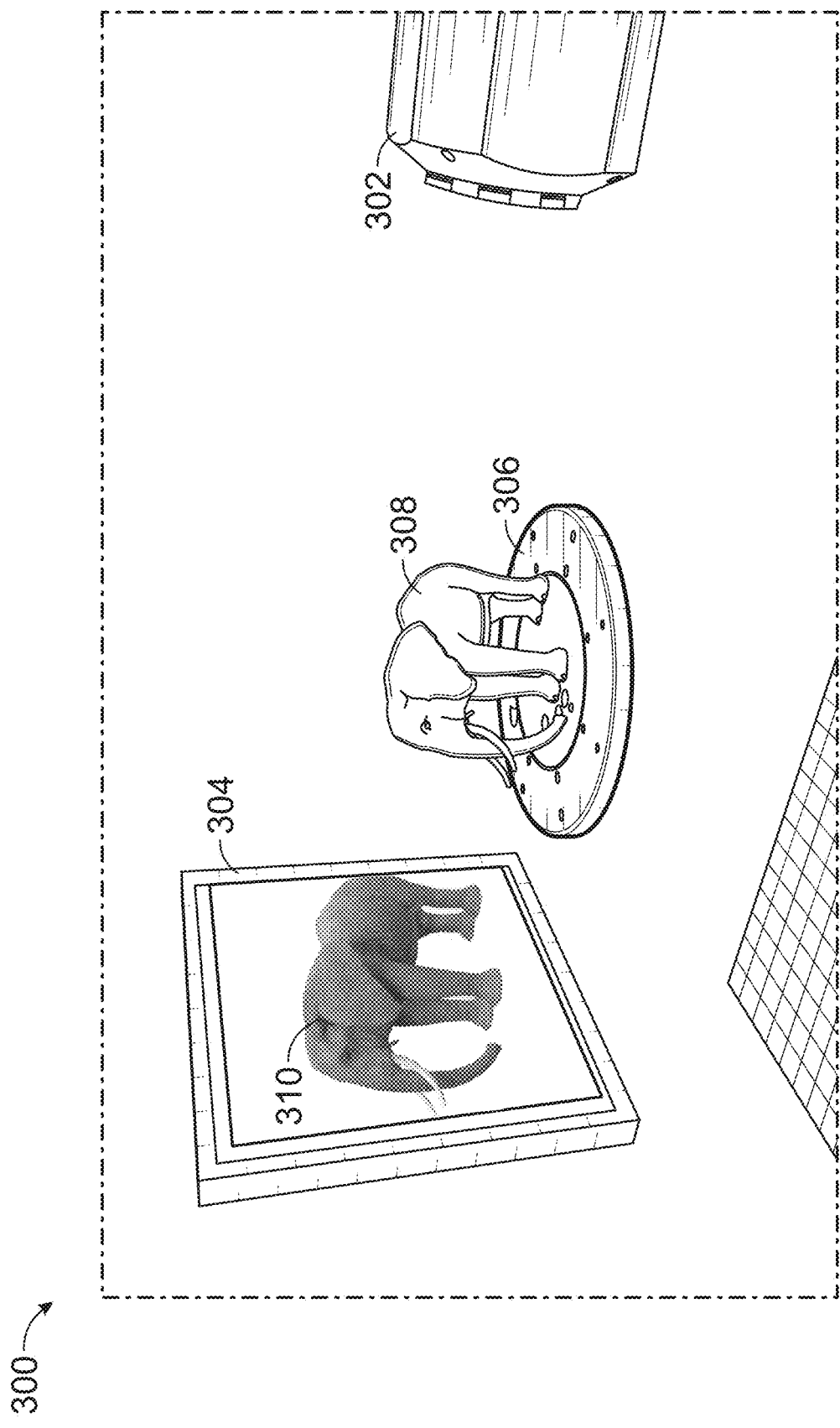

FIGS. 3D and 3E illustrate an example change in position and orientation of the positioner 306 and the workpiece 308 using the virtual environment 300, and an interactive change in the rendering of a projection 310 of the workpiece 308 on the radiation detector 304, which may be implemented on the scan procedure generation system 250 of FIG. 2. As shown in FIG. 3D, the user may select the workpiece positioner 306 for translation and/or rotation. In the illustrated example, the workpiece 308 may be tied by reference to the workpiece positioner 306, such that the workpiece 308 moves with the positioner 306 so as to maintain a same position and/or orientation relationship with the positioner 306.

In the example of FIG. 3D, the result of the translation of the positioner 306 is represented in the virtual environment 300 using a different visual style (e.g., a ghost representation 314 or other visually distinguishable representation of the positioner 306). The virtual environment 300 also indicates the direction 316 or plane of movement or orientation to aid the user in arranging the components 302-308.

FIG. 3E shows the virtual environment following the change in position performed in FIG. 3D. As illustrated in FIG. 3E, the scan procedure generation system 250 updates the simulation of the projection 310 based on the updated arrangement, and renders the updated projection 310 on the detector 304. Because the workpiece 308 is closer to the source 302, the workpiece 308 is a larger portion in the resulting image (as shown by the projection 310), and the interactions between the radiation and the workpiece 308 may change.

Figure 3F:
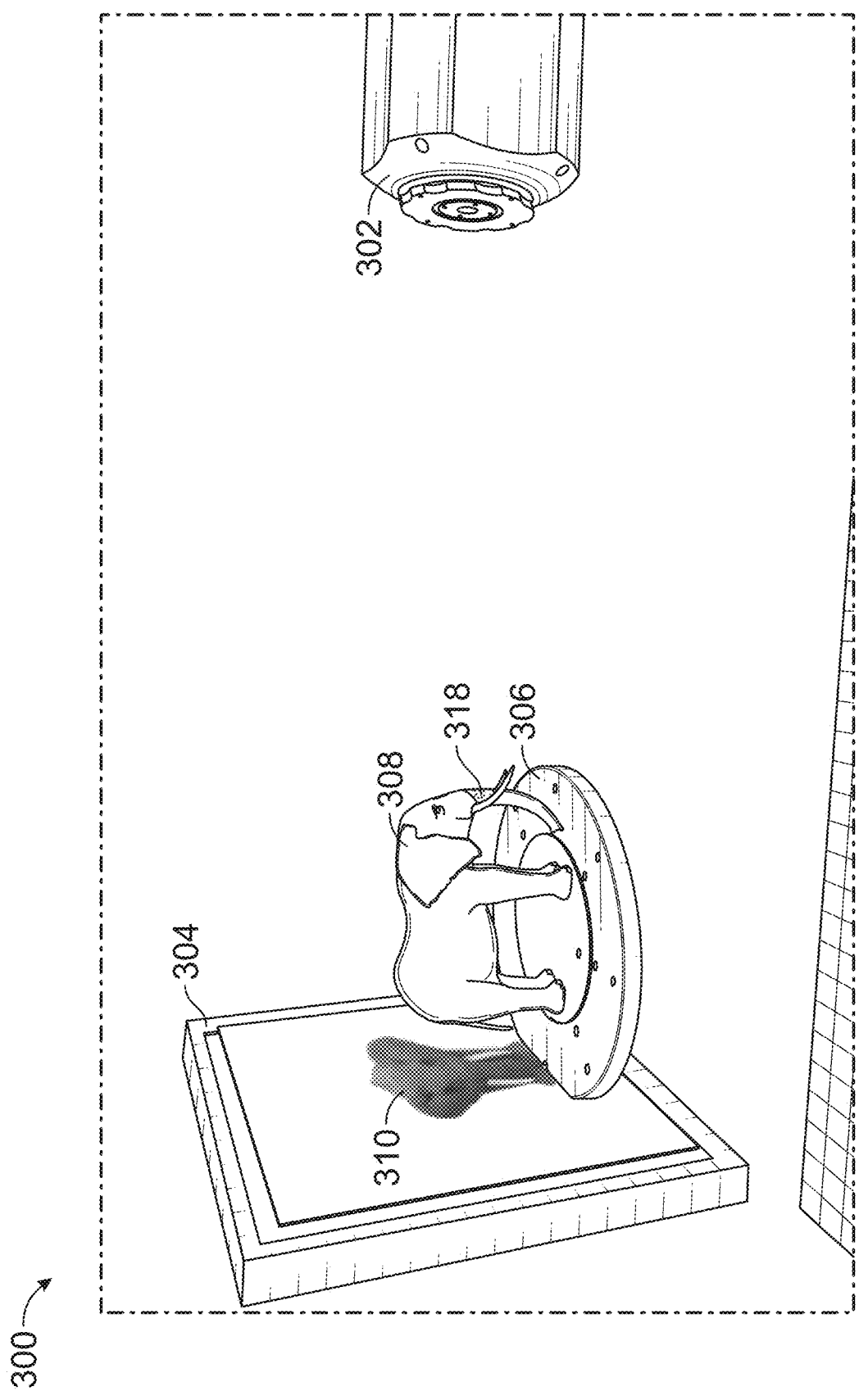
FIG. 3F illustrates an example object displayed in the example virtual environment, in which at least a portion of the workpiece is rendered to indicate a characteristic (e.g., a probable defect) of the workpiece, which may be implemented on the scan procedure generation system of FIG. 2.

FIG. 3F illustrates an example workpiece 308 displayed in the example virtual environment 300, in which at least a portion 318 of the workpiece 308 is rendered to indicate a characteristic (e.g., a probable defect) of the workpiece 308, which may be implemented on the scan procedure generation system 250 of FIG. 2. In some examples, the scan procedure generation system 250 may perform and/or invoke one or more modeling algorithms and/or simulations to analyze the CAD model of the workpiece 308. Example modeling algorithms that may be performed or invoked may include casting analysis algorithms, porosity analysis modeling, and/or stress analysis modeling, which may be used to analyze the CAD model for potential voids, discontinuities, porosity, inclusions, tolerance issues, and/or any other potential defects or risk sources that may occur during a casting process for manufacturing the workpiece 308 based on the CAD model. However, any other types of manufacturing modeling or analysis algorithms may be implemented or invoked.

The modeling algorithm and/or the scan procedure generation system 250 may specify a threshold or condition which merits attention during a DR or CT scan of the workpiece 308. In response to identifying one or more portions of the workpiece 308 using the modeling or analysis algorithm(s), the example scan procedure generation system 250 may render the identified portion of the workpiece 308 differently than other portions or the remainder of the workpiece 308 in the virtual environment 300. In some examples, different portions of the workpiece 308 may be identified via the modeling or analysis algorithm(s) for different reasons. The example scan procedure generation system 250 may render portions of the workpiece 308 identified using different algorithms by displaying different visual indications (e.g., different colors, different patterns, etc.), or may render identified portions in the same manner to visually indicate any regions of interest, regardless of the algorithm resulting in identification.

In some examples, the scan procedure generation system 250 automatically determines a scan procedure (e.g., component arrangements, movements, and/or parameters) to include identified portions of interest on the workpiece 308. The source parameters and/or the detector parameters may be selected based on a type of characteristic identified by one or more modeling or analysis algorithm(s).

Figure 7:
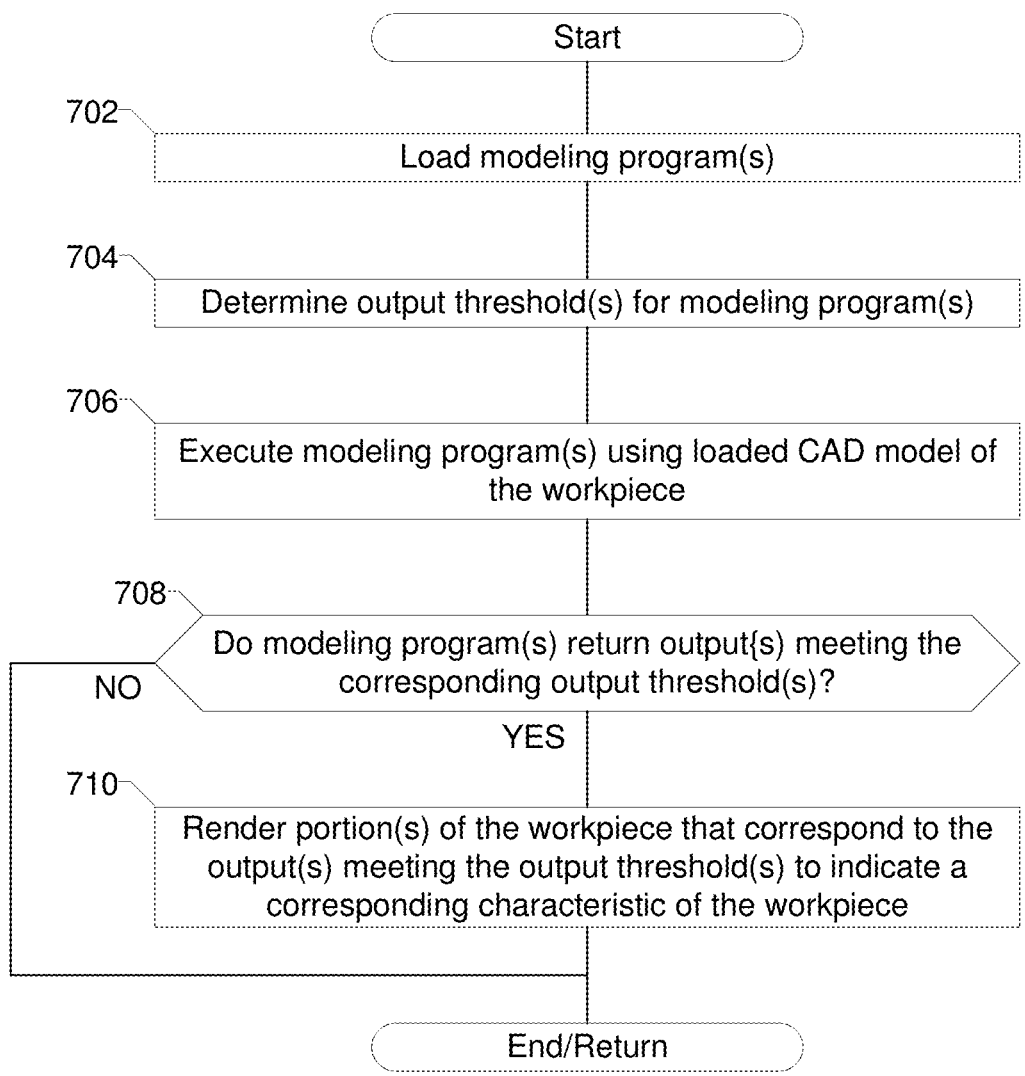
FIG. 7 is a flowchart representative of example machine readable instructions which may be executed by the example scan procedure generation system of FIG. 2 to render a portion of the workpiece to indicate a characteristic of the workpiece based on at least one of data in the CAD model or data received from a modeling algorithm based on the CAD model.

FIG. 7 is a flowchart representative of example machine readable instructions which may be executed by the example scan procedure generation system 250 of FIG. 2 to render a portion of the workpiece to indicate a characteristic of the workpiece based on at least one of data in the CAD model or data received from a modeling algorithm based on the CAD model.

At block 702, the scan procedure generation system 250 loads one or more modeling program(s) or algorithms. For example, the scan procedure generation system 250 may load a casting analysis algorithm if the workpiece 308 is manufactured via casting. The modeling program(s) may be selected automatically based on characteristics of the CAD model and/or may be selected manually by the user from a library of modeling program(s).

At block 704, the scan procedure generation system 250 determines output thresholds) for the modeling programs. For example, the user may specify quantitative thresholds that indicate the presence of characteristics of interest, such as discontinuities. In other examples, the modeling programs are configured with predetermined thresholds.

At block 706, the scan procedure generation system 250 executes the modeling program(s) using the loaded CAD model of the workpiece 308.

At block 708, the scan procedure generation system 250 determines whether any of the executed modeling program(s) return outputs that meet the corresponding output thresholds for indicating the presence or threshold likelihood of the characteristics modeled by the modeling programs.

If any of the executed modeling program(s) return outputs that meet the corresponding output thresholds (block 708), at block 710, the scan procedure generation system 250 renders the portion(s) 320 of the workpiece 308 that correspond to the output(s) meeting the output threshold(s) to indicate a corresponding characteristic of the workpiece 308. For example, the scan procedure generation system 250 may render the portion 318 with a different color and/or pattern than the remainder of the workpiece 308 to indicate the presence of one or more modeled characteristics (e.g., discontinuities, etc.) in the portion 318 of the workpiece 308.

After rendering the portions 318 (block 710), or if none of the modeling algorithms identify a characteristic (block 708), the example instructions 700 end.

Figure 3G:
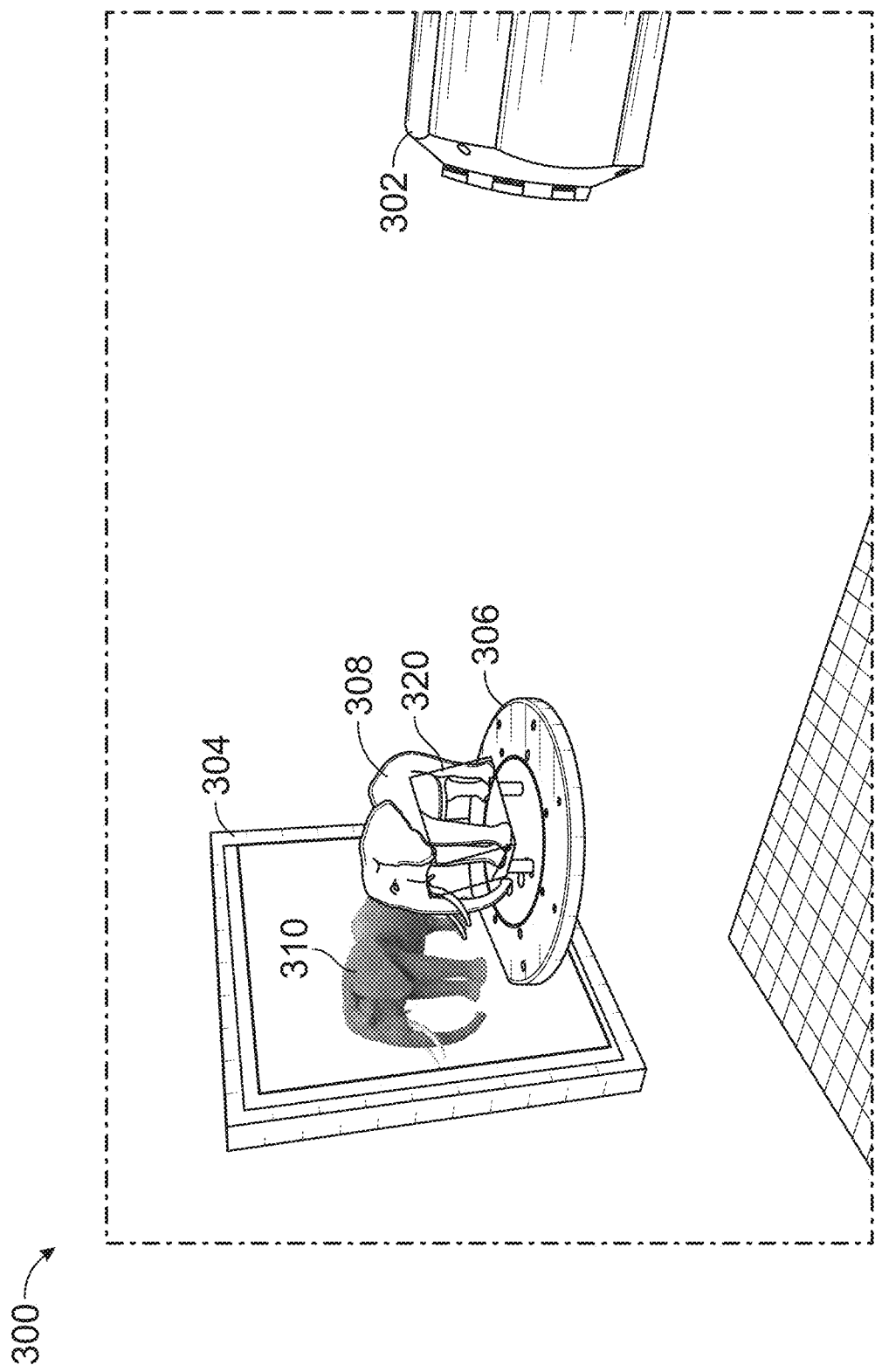
FIG. 3G illustrates an example object displayed in the example virtual environment, including an automatically generated fixture configured to support the object on a manipulator, which may be implemented on the scan procedure generation system of FIG. 2.

FIG. 3G illustrates the example workpiece 308 displayed in the example virtual environment 300, including an automatically generated fixture 320 configured to support the object on the workpiece positioner 306, which may be implemented on the scan procedure generation system 250 of FIG. 2. As illustrated in FIG. 3F, the user may determine that a relatively unstable orientation of the workpiece 308 on the positioner 306 would result in a desired DR or CT scan, in which a more stable orientation would not. Rather than require the operator of the scanning system 100 to determine an appropriate way in which to stabilize the workpiece 308, the example scan procedure generation system 250 may automatically design (or automatically invoke another program to design) a fixture 320 that can stabilize the workpiece 308. Additionally or alternatively, the fixture 320 may be designed to secure the positioner 306 (e.g., via features in the positioner 306 that allow for attachment of accessories).

In the example of FIG. 3F, the scan procedure generation system 250 may determine the center of gravity of the workpiece 308, the exterior contours (e.g., contact points) of the workpiece 308, and/or any other features of the workpiece 308 based on the CAD model. Based on the configured orientation of the workpiece 308, the data from the CAD model, and the positioner 306, the example scan procedure generation system 250 calculates and generates a CAD model of a physical fixture 320 to support and stabilize the workpiece 308 on the positioner 306. In some examples, the fixture 320 is further designed to secure the workpiece 308 to the positioner 306 so as to provide a consistent location and/or orientation of the workpiece 308 with respect to the positioner 306.

In some examples, the user may select to physically generate one or more copies of the fixture 320 via 3D printing or other additive manufacturing and/or machining techniques. In response to such a selection, the scan procedure generation system 250 may export the generated CAD file to an external device (e.g., a 3D printer, a contract manufacturer, etc.) for manufacture. In other examples, the CAD file of the fixture 320 may be packaged with the generated scan procedure for use by the operator of the scanning system 100 at the time the physical copies of the workpiece 308 are to be scanned via the system 100.

Figure 8:
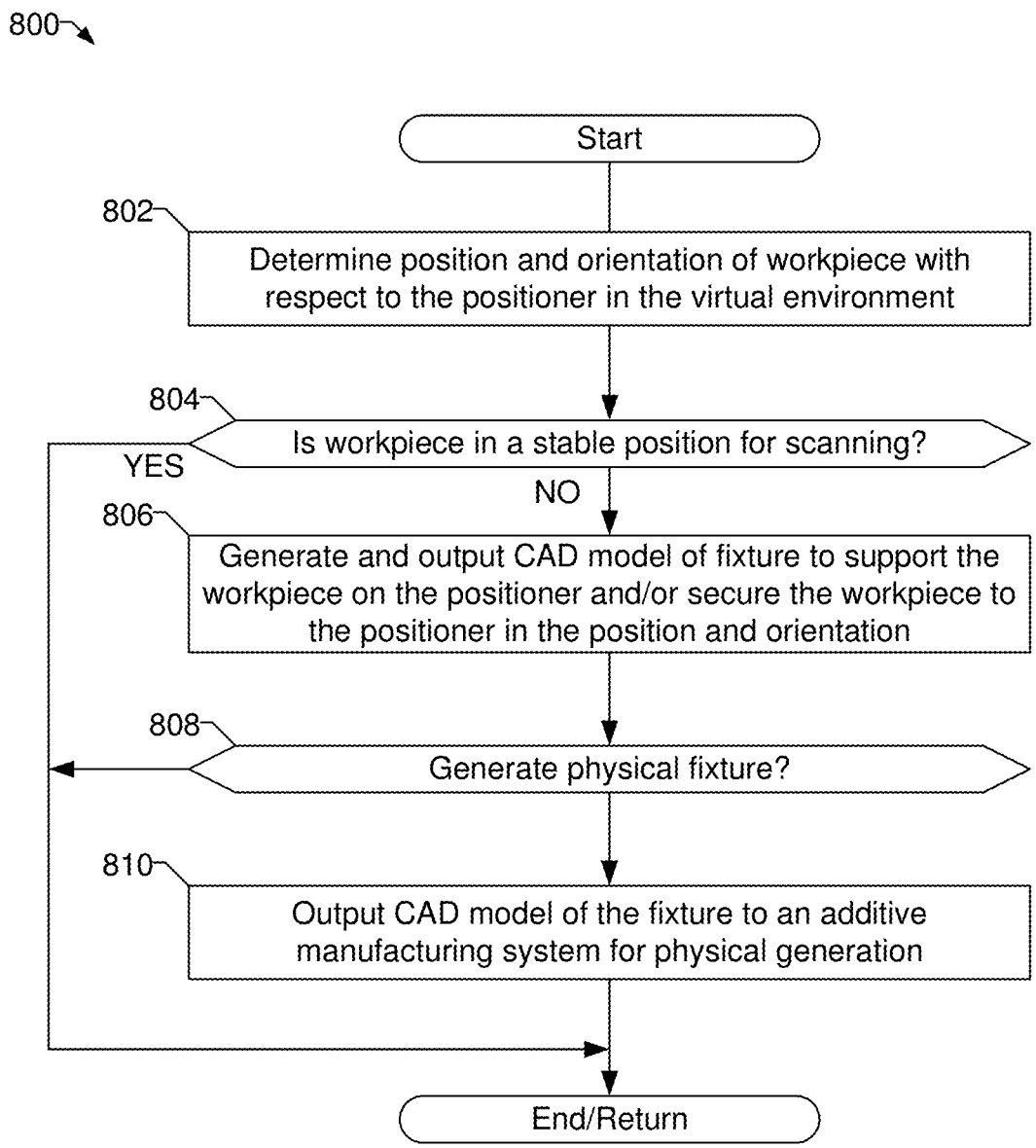
FIG. 8 is a flowchart representative of example machine readable instructions which may be executed by the example scan procedure generation system of FIG. 2 to generate a fixture model to support the workpiece on the workpiece positioner as defined in the generated scanning procedure.

FIG. 8 is a flowchart representative of example machine readable instructions 800 which may be executed by the example scan procedure generation system 250 of FIG. 2 to generate a fixture model to support the workpiece 308 on the workpiece positioner 306 as defined in the generated scanning procedure.

At block 802, the scan procedure generation system 250 determines a position and orientation of the workpiece 308 with respect to the positioner 306 in the virtual environment 300. For example, the scan procedure generation system 250 may determine the points of contact and/or support provided to the workpiece 308 by the positioner 306 based on the position and orientation of the workpiece 308 by the user.

At block 804, the scan procedure generation system 250 determines whether the workpiece 308 is in a stable position for scanning. For example, the scan procedure generation system 250 may determine whether a calculated center of gravity of the workpiece 308 is in a position relative to the support points that could cause the workpiece 308 to destabilize during the scanning procedure e.g., in a static position, during movement and/or rotation of the positioner 306, etc.).

At block 806, the scan procedure generation system 250 generates and outputs a CAD model of a fixture (e.g., the fixture 320) to support the workpiece on the positioner 306 and/or to secure the workpiece 308 to the positioner 306 in the configured position and orientation. For example, the scan procedure generation system 250 may use a fixture generation algorithm to generate: structures that contact points on the positioner 306 based on the geometries of the workpiece 308 and the positioner 306 and based on the position and orientation of the workpiece 308 with respect to the positioner 306; structures configured to contact points on the workpiece 308 (e.g., points at or near the extremities of the workpiece 308, points having higher densities and/or weight, etc.) to support the workpiece 308 at those points using the structures contacting the positioner 306; bridge structures to connect the structures contacting the positioner 306 and the workpiece 308; and/or locating structures that can be used to locate the fixture 320, and thereby locate the workpiece 308, at a specific point and orientation on the positioner 306.

The resulting CAD model may be any desired format, and may be stored or incorporated into a generated scan procedure for the workpiece 308 to enable the operator of the scanning system 100 to access and quickly generate (e.g., via a 3D printer or other additive manufacturing device) the desired fixturing for the scanning procedure and workpiece 308.

At block 808, the scan procedure generation system 250 determines whether the physical fixture is to be generated. For example, the user of the scan procedure generation system 250 and/or the operator of the scanner positioning control system 200 may select to generate a physical copy of the fixture 320. If the physical copy of the fixture 320 is to be generated (block 808), at block 810 the scan procedure generation system 250 (or the scanner positioning control system 200) outputs the CAD model of the fixture 320 to an additive manufacturing system for physical generation.

After outputting the CAD model of the fixture 320 (block 810), if a physical fixture is not to be created (block 808), or if the workpiece 308 is in a stable position for scanning (and the user does not otherwise select creation of a fixture model), the example instructions 800 end.

Figure 3H:
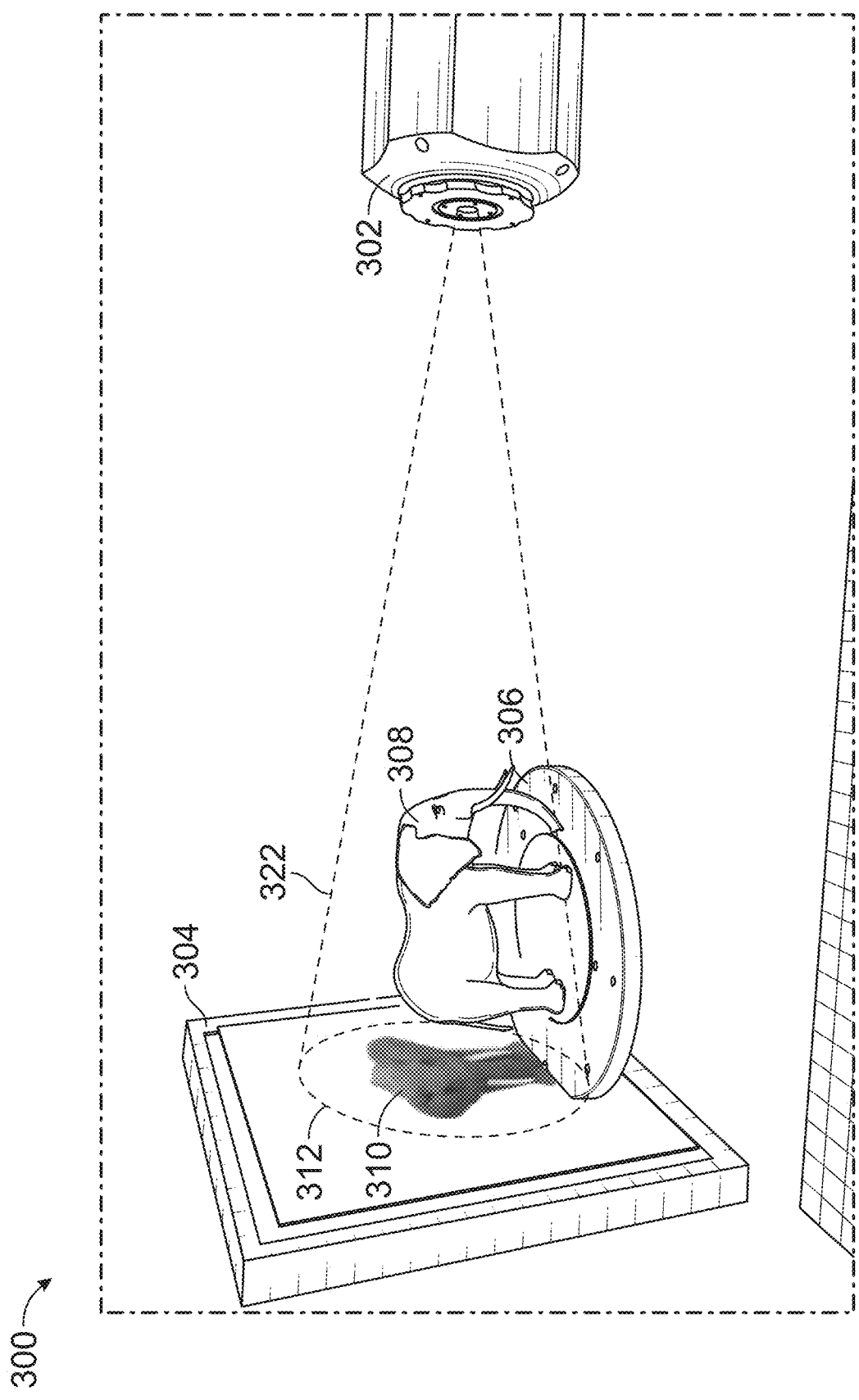
FIG. 3H illustrates an example object displayed in the example virtual environment, including a rendering of a cone of radiation emitted by a radiation source, which may be implemented on the scan procedure generation system of FIG. 2.

FIG. 3H illustrates the example workpiece 308 displayed in the example virtual environment 300, including a rendering of a cone of radiation 322 emitted by the radiation source 302, which may be implemented on the scan procedure generation system 250 of FIG. 2. The scan procedure generation system 250 calculates the boundaries of the cone of radiation 322 based on the arrangement and parameters of the radiation source 302 in the virtual environment, such as the distance between the radiation source 302 and the radiation detector 304, collimation, and/or any other parameters. The scan procedure generation system 250 may then render the calculated cone of radiation 322 with or without simulating and rendering the projection 310, as desired by the user. In other examples, the scan procedure generation system 250 may project and/or render other positioning aids into the virtual environment, such as a radiation focal point, scatter radiation, beam collimation, and/or any other aids or effects.

Additionally or alternatively, the user may designate portions of the detector 304 as non-functional or having another malfunction (e.g., loss of detector resolution), which is then included in any simulations or reconstructions by the scan procedure generation system 250 to enable the user to design the scanning procedure around anticipated or potential problematic areas.

Figure 9:
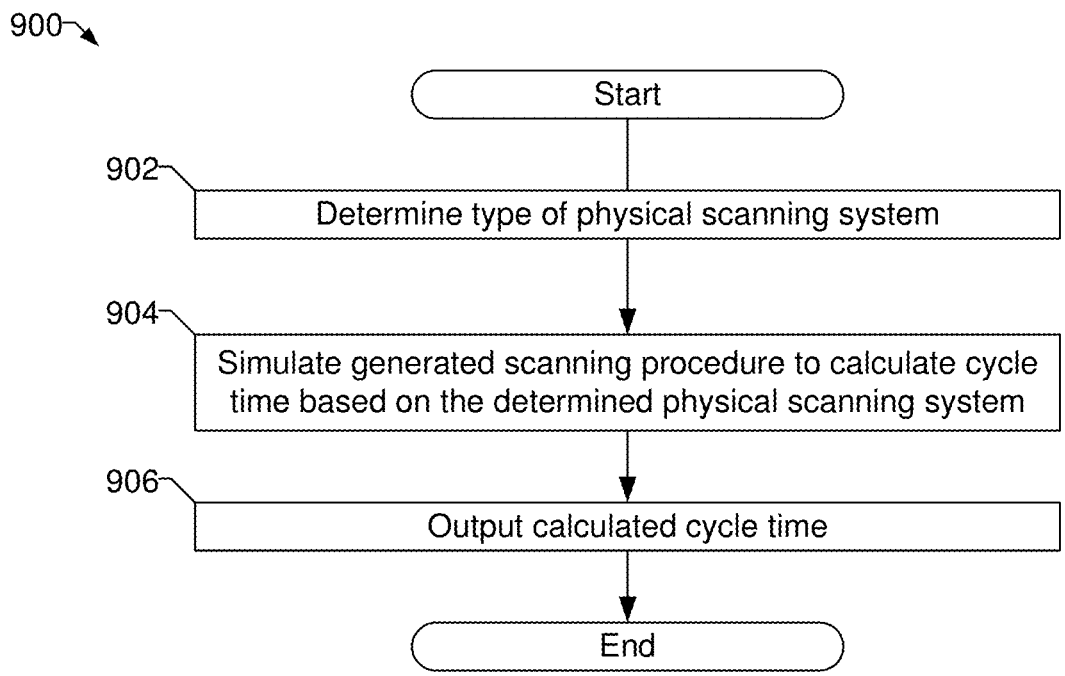
FIG. 9 is a flowchart representative of example machine readable instructions which may be executed by the example scan procedure generation system of FIG. 2 to calculate a cycle time to physically perform the generated scanning procedure.

FIG. 9 is a flowchart representative of example machine readable instructions 900 which may be executed by the example scan procedure generation system 250 of FIG. 2 to calculate a cycle time to physically perform the generated scanning procedure. The example instructions 900 are described below with reference to the example virtual environment of FIGS. 3A and 3B, and the scan procedure generation system 250, and may be executed to implement block 412 of FIG. 4.

At block 902, the scan procedure generation system 250 determines a type of the physical scanning system 100. For example, the user of the scan procedure generation system 250 may select the model and/or one or more characteristics of the physical scanning system 100 from a list or menu of options, and/or may enter other data that may be used by the scan procedure generation system 250 to calculate cycle time.

At block 904, the scan procedure generation system 250 simulates a generated scanning procedure to calculate a cycle time based on the determined physical scanning system 100. For example, the scan procedure generation system 250 may determine the cycle time to include estimated time to position of the workpiece 308 and/or any required fixturing, enclosure closing time, radiation source warm-up time, image capture time including integration time and number of radiographs, enclosure opening time, workpiece and/or fixturing removal time, and/or any other aspects of performing the physical scan of a generated scanning procedure.

At block 906, the scan procedure generation system 250 outputs the calculated cycle time. The calculated cycle time may be used by the scan procedure generation system 250 as a factor to score or compare potential scanning procedures for selection (e.g., block 612 of FIG. 6), because reducing cycle time can be an advantageous feature of a scanning procedure. The example instructions 900 may then end.

Figure 10:
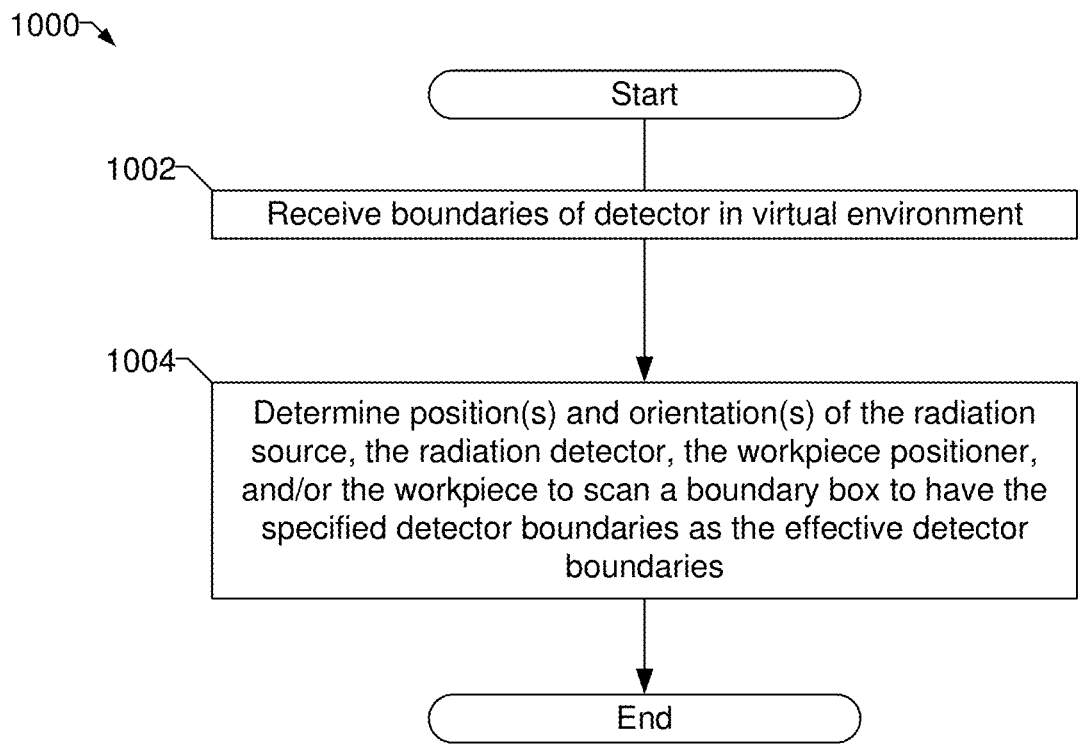
FIG. 10 is a flowchart representative of example machine readable instructions which may be executed by the example scan procedure generation system of FIG. 2 to generate the scanning procedure based on dimensions of a virtual detector which are larger corresponding dimensions of a physical detector to perform the scanning procedure.

FIG. 10 is a flowchart representative of example machine readable instructions 1000 which may be executed by the example scan procedure generation system 250 of FIG. 2 to generate the scanning procedure based on dimensions of a virtual detector which are larger corresponding dimensions of a physical detector to perform the scanning procedure. For example, the virtual environment 300 may enable the user to configure a size of the radiation detector 304 to be larger than the actual size or dimensions of the detector 106. The resulting scanning procedure is generated to include multiple radiographs for each workpiece position to allow for movement of the emitter 104, the detector 106, and/or positioner 110 and workpiece 108, to effectively match the dimensions of the defined virtual detector.

At block 1002, the scan procedure generation system 250 receives boundaries (e.g., dimensions and positions) of the detector 304 in the virtual environment, as specified by the operator. In some examples, the scan procedure generation system 250 automatically configures dimensions and positions of the virtual detector based on a size of the workpiece 308 and/or the boundary box 312, as well as the desired source and/or detector parameters (e.g., if a desired image quality cannot be obtained in a single radiograph for a given workpiece position).

At block 1004, the scan procedure generation system 250 determines position(s) and orientation(s) of the components 302-308 to scan a boundary box 312 to have the specified detector boundaries and the effective detector boundaries. The position(s) and orientation(s) of the components 302-308 may be used by the scan procedure generation system 250 to automatically generate the scanning procedure to scan the workpiece 308 as disclosed above. The example scan procedure generation system 250 may further include image stitching instructions to enable the scanning system 100 to stitch multiple radiographs taken for a given workpiece position and orientation into a single image having the effective dimensions of the virtual detector. The example instructions 1000 then end.

While the foregoing examples refer to linear actuators, any other type(s) of actuator(s) or manipulator(s) may be used to physical position and/or manipulate the X-ray emitter 104, the X-ray detector 106, the workpiece positioner 110, the workpiece, and/or any other components. For example, the actuator(s) 116, 118, 120 may include 6 degree-of-freedom robot manipulators, rotational actuators (e.g., direct rotation, worm gear rotation, etc.), and/or any other type of actuator, which may be reflected in the virtual environment 300 of FIGS. 3A-3H.

Figure 11:
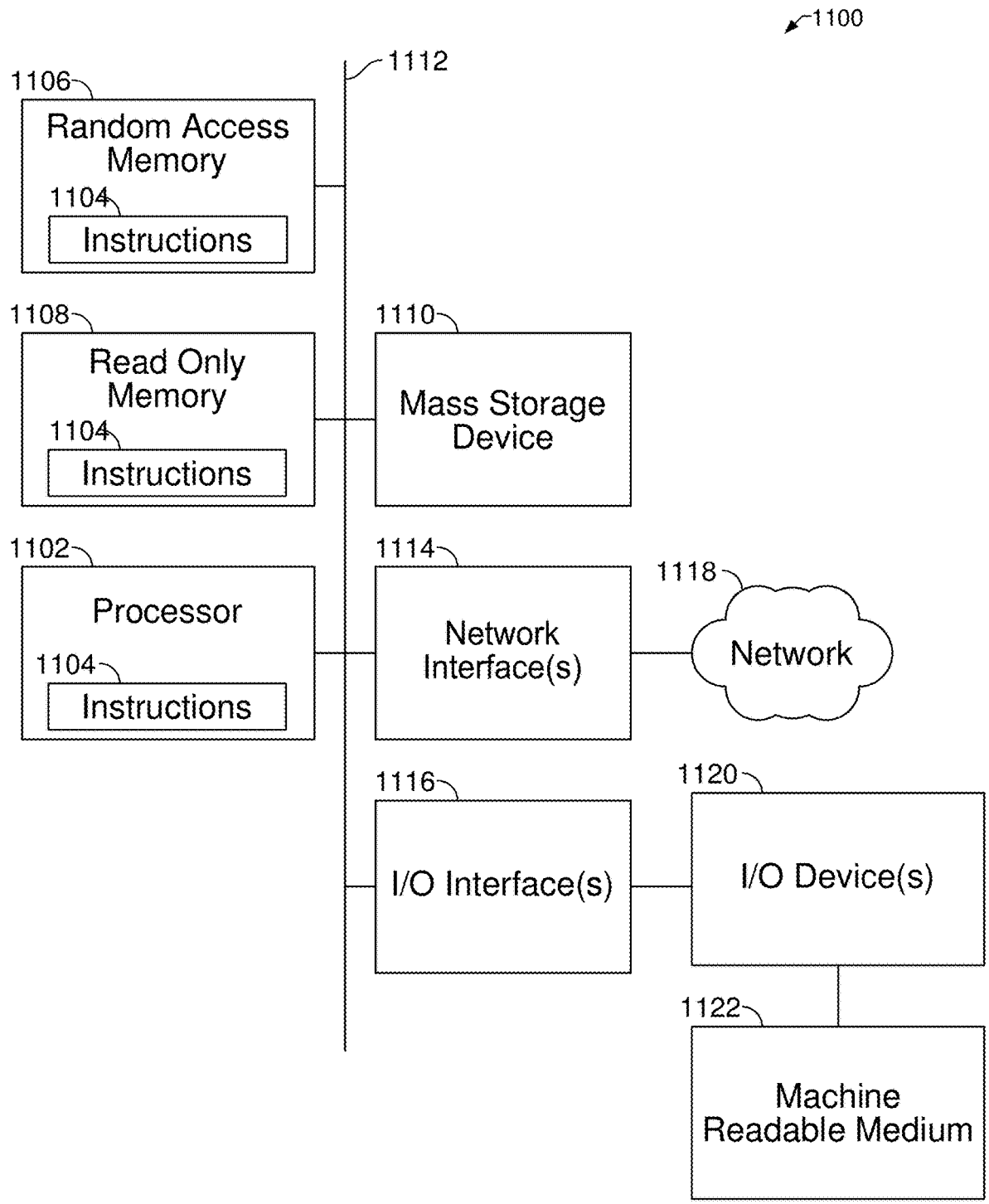
FIG. 11 is a block diagram of an example computing system that may be used to implement the scanner positioning control system and/or the scan procedure generation system of FIG. 2.

FIG. 11 is a block diagram of an example computing system 1100 that may be used to implement the scanner positioning control system 200 and/or the scan procedure generation system 250 of FIG. 2. The example computing system 1100 may be implemented using a personal computer, a server, a smartphone, a laptop computer, a workstation, a tablet computer, and/or any other type of computing device.

The example computing system 1100 of FIG. 11 includes a processor 1102. The example processor 1102 may be any general purpose central processing unit (CPU) from any manufacturer. In some other examples, the processor 1102 may include one or more specialized processing units, such as RISC processors with an ARM core, graphic processing units, digital signal processors, and/or system-on-chips (SoC). The processor 1102 executes machine readable instructions 1104 that may be stored locally at the processor (e.g., in an included cache or SoC), in a random access memory 1106 (or other volatile memory), in a read only memory 1108 (or other non-volatile memory such as FLASH memory), and/or in a mass storage device 1110. The example mass storage device 1110 may be a hard drive, a solid state storage drive, a hybrid drive, a RAID array, and/or any other mass data storage device.

A bus 1112 enables communications between the processor 1102, the RAM 1106, the ROM 1108, the mass storage device 1110, a network interface 1114, and/or an input/output interface 1116.

The example network interface 1114 includes hardware, firmware, and/or software to connect the computing system 1100 to a communications network 1118 such as the Internet. For example, the network interface 1114 may include IEEE 802.X-compliant wireless and/or wired communications hardware for transmitting and/or receiving communications.

The example I/O interface 1116 of FIG. 11 includes hardware, firmware, and/or software to connect one or more input/output devices 1120 to the processor 1102 for providing input to the processor 1102 and/or providing output from the processor 1102. For example, the I/O interface 1116 may include a graphics processing unit for interfacing with a display device, a universal serial bus port for interfacing with one or more USB-compliant devices, a FireWire, a field bus, and/or any other type of interface. Example I/O device(s) 1120 may include a keyboard, a keypad, a mouse, a trackball, a pointing device, a microphone, an audio speaker, an optical media drive, a multi-touch touch screen, a gesture recognition interface, a display device (e.g., the display device(s) 208, 258) a magnetic media drive, and/or any other type of input and/or output device.

The example computing system 1100 may access a non-transitory machine readable medium 1122 via the I/O interface 1116 and/or the I/O device(s) 1120. Examples of the machine readable medium 1122 of FIG. 11 include optical discs (e.g., compact discs (CDs), digital versatile/video discs (DVDs), Blu-ray discs, etc.), magnetic media (e.g., floppy disks), portable storage media (e.g., portable flash drives, secure digital (SD) cards, etc.), and/or any other type of removable and/or installed machine readable media.

Example wireless interfaces, protocols, and/or standards that may be supported and/or used by the network interface(s) 1114 and/or the I/O interface(s) 1116, include wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB); etc. Example wired interfaces, protocols, and/or standards that may be supported and/or used by the network interface(s) 1114 and/or the I/O interface(s) 1116, such as to communicate with the display device(s) 212, include comprise Ethernet (IEEE 802.3), Fiber Distributed Data Interface (FDDI), Integrated Services Digital Network (ISDN), cable television and/or internet (ATSC, DVB-C, DOCSIS), Universal Serial Bus (USB) based interfaces, etc.

The processor 1102, the network interface(s) 1114, and/or the I/O interface(s) 1116 may perform signal processing operations such as, for example, filtering, amplification, analog-to-digital conversion and/or digital-to-analog conversion, up-conversion/down-conversion of baseband signals, encoding/decoding, encryption/decryption, modulation/demodulation, and/or any other appropriate signal processing.

The computing system 1100 may use one or more antennas for wireless communications and/or one or more wired port(s) for wired communications. The antenna(s) may be any type of antenna (e.g., directional antennas, omnidirectional antennas, multi-input multi-output (MIMO) antennas, etc.) suited for the frequencies, power levels, diversity, and/or other parameters required for the wireless interfaces and/or protocols used to communicate. The port(s) may include any type of connectors suited for the communications over wired interfaces/protocols supported by the computing system 1100. For example, the port(s) may include an Ethernet over twisted pair port, a USB port, an HDMI port, a passive optical network (PON) port, and/or any other suitable port for interfacing with a wired or optical cable.

The present methods and systems may be realized in hardware, software, and/or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may include a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein. As used herein, the term "non-transitory machine-readable medium" is defined to include all types of machine readable storage media and to exclude propagating signals.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed is:

1. A scan procedure generation system, comprising:
   a display;
   a processor; and
   a computer readable storage medium comprising computer readable instructions which, when executed, cause the processor to:
   output, via the display, a first visual representation of an arrangement of a radiation source, a radiation detector, a workpiece positioner, and a workpiece; and
   based on positions and orientations of the radiation source, the radiation detector, the workpiece positioner, and the workpiece, generate a scanning procedure for execution by a physical scanner having a physical radiation source, a physical radiation detector, and a physical workpiece positioner,
   wherein the generated scanning procedure comprises a plurality of movements of one or more of the physical radiation source, the physical radiation detector, and the physical workpiece positioner and a plurality of image captures to capture a plurality of scan images of a physical workpiece corresponding to the workpiece in the first virtual representation.

2. The scan procedure generation system as defined in claim 1, wherein the computer readable instructions cause the processor to:
   identify a change to be made to the arrangement of at least one of the radiation source, the radiation detector, the workpiece positioner, or the workpiece; and
   output, via the display, a second visual representation of the arrangement of the radiation source, the radiation detector, the workpiece positioner, and the workpiece based on the change to be made to the arrangement.

3. The scan procedure generation system as defined in claim 2, wherein the computer readable instructions cause the processor to:
   render a projection of the workpiece on the radiation detector based on an arrangement of the radiation source, the radiation detector, the workpiece positioner, and the workpiece; and
   update the projection of the workpiece on the radiation detector in real-time in response to changes in the arrangement of one or more of the radiation source, the radiation detector, the workpiece positioner, or the workpiece.

4. The scan procedure generation system as defined in claim 3, wherein the computer readable instructions cause the processor to calculate the projection based on at least one of beam hardening; radiation energy or wavelength; a spectrum and/or other characteristics of a polychromatic beam; randomization or error in the accuracy of motion or positioning of one or more of the scanner components; motion dynamics; alignment of the radiation source, the radiation detector, the workpiece positioner, and the workpiece; accuracy or tolerance in positioning the workpiece on the workpiece positioner; a collimation characteristic of the radiation source; a focal spot size and/or shape of the radiation source; radiation scatter; the selected radiation spectrum; non-uniformity of the radiation cone; radiation flux; component degradation; variation in radiation emissions by the radiation source; source warmup time; scintillator efficiency of the radiation detector; scintillator resolution of the radiation detector; blur of the radiation detector; noise at the radiation detector; a defect in the radiation detector.

5. The scan procedure generation system as defined in claim 2, wherein the computer readable instructions cause the processor to determine whether a collision between one or more of the radiation source, the radiation detector, the workpiece positioner, or the workpiece and at least one other component has at least a threshold likelihood based on at least one of the first arrangement, a second arrangement following the change, or a movement from the first arrangement to the second arrangement.

6. The scan procedure generation system as defined in claim 5, wherein the computer readable instructions cause the processor to determine whether the collision has at least a threshold likelihood based further on positioning of one or more additional components in the physical scanner.

7. The scan procedure generation system as defined in claim 1, wherein the computer readable instructions cause the processor to render at least one of a cone of radiation or radiation collimation based on positioning of the radiation source.

8. The scan procedure generation system as defined in claim 1, wherein the computer readable instructions cause the processor to render a projection of the workpiece on the radiation detector based on positioning of the radiation source, the radiation detector, the workpiece positioner, and the workpiece, and based on one or more radiation emission characteristics of the radiation source.

9. The scan procedure generation system as defined in claim 1, wherein the computer readable instructions cause the processor to generate a fixture model to support the workpiece on the workpiece positioner as defined in the generated scanning procedure.

10. The scan procedure generation system as defined in claim 1, wherein the computer readable instructions cause the processor to load the workpiece into the first visual representation based on a computer aided drafting (CAD) model of the workpiece.

11. The scan procedure generation system as defined in claim 10, wherein the computer readable instructions cause the processor to render a portion of the workpiece to indicate a characteristic of the workpiece based on at least one of data in the CAD model or data received from a modeling algorithm based on the CAD model.

12. The scan procedure generation system as defined in claim 1, wherein the computer readable instructions cause the processor to automatically determine one or more arrangements and movements of the radiation source, the radiation detector, the workpiece positioner, and the workpiece to generate a scan of the workpiece.

13. The scan procedure generation system as defined in claim 12, wherein the computer readable instructions cause the processor to automatically determine the one or more arrangements and movements based on an identification of a boundary box enveloping a portion of the workpiece.

14. The scan procedure generation system as defined in claim 12, wherein the computer readable instructions cause the processor to automatically determine the one or more arrangements and movements based on simulating two or more potential generated scanning procedures to determine respective three-dimensional computed tomography results or three-dimensional digital radiography results and comparing one or more aspects of the results determined via the simulations.

15. The scan procedure generation system as defined in claim 1, wherein the computer readable instructions cause the processor to simulate one or more sources of error in at least one of: the positioning of one or more of the radiation source, the radiation detector, the workpiece positioner, and the workpiece; movement of one or more of the radiation source, the radiation detector, the workpiece positioner, and the workpiece; an emission characteristic of X-ray radiation emitted by the radiation source; a detection characteristic of the radiation detector; or a characteristic of X-ray radiation in the system.

16. The scan procedure generation system as defined in claim 1, wherein the computer readable instructions cause the processor to calculate a cycle time to physically perform the generated scanning procedure.

17. The scan procedure generation system as defined in claim 1, wherein the computer readable instructions cause the processor to calculate a three-dimensional computed tomography result or a three-dimensional digital radiography result based on simulating the generated scanning procedure.

18. The scan procedure generation system as defined in claim 1, wherein the generated scanning procedure comprises second instructions to be executed by the physical scanner to perform the plurality of movements and the plurality of image captures.

19. The scan procedure generation system as defined in claim 18, wherein the generated scanning procedure is associated with an identifier of the workpiece.

20. The scan procedure generation system as defined in claim 1, wherein the instructions cause the processor to:
- determine dimensions of a virtual detector via the virtual environment, at least one of the dimensions being larger than a corresponding dimension of the physical radiation detector; and
- generate the scanning procedure based on the determined dimensions, the scanning procedure comprising arrangements of the physical radiation detector to meet the dimensions of the virtual detector.

* * * * *